United States Patent
Okuno et al.

(10) Patent No.: US 9,941,314 B2
(45) Date of Patent: Apr. 10, 2018

(54) PHASE DIFFERENCE DETECTION WHILE SUPPRESSING DETERIORATION OF RESOLUTION

(71) Applicant: SONY CORPORATION, Tokyo (JP)

(72) Inventors: Jun Okuno, Kumamoto (JP); Kazuyoshi Yamashita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/898,942

(22) PCT Filed: Jun. 23, 2014

(86) PCT No.: PCT/JP2014/066566
§ 371 (c)(1),
(2) Date: Dec. 16, 2015

(87) PCT Pub. No.: WO2015/002006
PCT Pub. Date: Jan. 8, 2015

(65) Prior Publication Data
US 2016/0372503 A1    Dec. 22, 2016

(30) Foreign Application Priority Data

Jul. 5, 2013 (JP) .................................. 2013-141761
Apr. 30, 2014 (JP) .................................. 2014-093510

(51) Int. Cl.
*H01L 27/146* (2006.01)
*H04N 5/369* (2011.01)

(52) U.S. Cl.
CPC .. *H01L 27/14603* (2013.01); *H01L 27/14609* (2013.01); *H01L 27/14623* (2013.01);
(Continued)

(58) Field of Classification Search
CPC ......... H01L 27/14603; H01L 27/14645; H01L 27/14623; H01L 27/14656; H01L 27/14627; H04N 5/3696
See application file for complete search history.

(56) References Cited

U.S. PATENT DOCUMENTS

2011/0109776 A1* 5/2011 Kawai .................... H04N 5/374
348/273
2011/0164166 A1* 7/2011 Oikawa ................ H04N 5/3696
348/340
(Continued)

FOREIGN PATENT DOCUMENTS

JP     2007-243744 A    9/2007
JP     2009-105878 A    5/2009
(Continued)

*Primary Examiner* — Gevell Selby
(74) *Attorney, Agent, or Firm* — Chip Law Group

(57) ABSTRACT

The present technology relates to a solid-state imaging device and a driving method thereof, and an electronic apparatus that make it possible to improve the precision of phase difference detection while suppressing deterioration of resolution in a solid-state imaging device having a global shutter function and a phase difference AF function. Provided is a solid-state imaging device including: a pixel array unit including, as pixels including an on-chip lens, a photoelectric conversion unit, and a charge accumulation unit, imaging pixels for generating a captured image and phase difference detection pixels for performing phase difference detection arrayed therein; and a driving control unit configured to control driving of the pixels. The imaging pixel is formed with the charge accumulation unit shielded from light. The phase difference detection pixel is formed in a manner that at least part of at least one of the photoelectric conversion unit and the charge accumulation unit refrains from being shielded from light. The present technology can be applied to, for example, a CMOS image sensor.

19 Claims, 31 Drawing Sheets

(52) U.S. Cl.
CPC .. *H01L 27/14627* (2013.01); *H01L 27/14645* (2013.01); *H01L 27/14656* (2013.01); *H04N 5/3696* (2013.01)

(56) References Cited

U.S. PATENT DOCUMENTS

2012/0188425 A1* 7/2012 Kita .................. H04N 5/23212
                                                                 348/294
2013/0182156 A1* 7/2013 Moriya ................. H04N 5/335
                                                                 348/294

FOREIGN PATENT DOCUMENTS

| JP | 2010-193139 A | 9/2010 |
| JP | 2011-234025 A | 11/2011 |
| JP | 2012-151774 A | 8/2012 |

\* cited by examiner

PHASE DIFFERENCE DETECTION WHILE SUPPRESSING DETERIORATION OF RESOLUTION

TECHNICAL FIELD

The present technology relates to solid-state imaging devices and driving methods thereof, and electronic apparatuses. The present technology particularly relates to a solid-state imaging device and a driving method thereof, and an electronic apparatus that make it possible to improve the precision of phase difference detection while suppressing deterioration of resolution in a solid-state imaging device having a global shutter function and a phase difference AF function.

BACKGROUND ART

There conventionally have been solid-state imaging devices that implement an auto focus (AF) function by mixing phase difference detection pixels among imaging pixels. Such a solid-state imaging device implements an AF function (hereinafter called phase difference AF function) of a phase difference detection method by shielding different halves of the respective photoelectric conversion units of a pair of phase difference detection pixels from light and using a difference between the respective outputs of the pair of phase difference detection pixels.

There also have been solid-state imaging devices that implement a global shutter function by including, in each pixel, a charge retention unit that retains charge transferred from a photoelectric conversion unit. Such a solid-state imaging device implements the global shutter function by performing transfer and retention of charge in all the pixels simultaneously so that exposure periods coincide among all the pixels.

Furthermore, solid-state imaging devices having both the global shutter function and the phase difference AF function have been proposed in recent years (e.g., see Patent Literatures 1 and 2).

CITATION LIST

Patent Literature

Patent Literature 1: JP 2007-243744A
Patent Literature 2: JP 2012-151774A

SUMMARY OF INVENTION

Technical Problem

In the technology of Patent Literature 1, one phase difference detection pixel includes two sets of a photoelectric conversion unit and a charge retention unit. Therefore, the light-receiving area of the photoelectric conversion unit is reduced and the sensitivity of the phase difference detection pixel is lowered, resulting in lowered precision of phase difference detection.

In the technology of Patent Literature 2, a set of two pixels of an imaging pixel and a phase difference detection pixel is formed. Therefore, the number of effective pixels of the whole solid-state imaging device is reduced by half and the resolution of the output image is lowered.

The present technology, which has been made in view of such circumstances, makes it possible to improve the precision of phase difference detection while suppressing deterioration of resolution in a solid-state imaging device having a global shutter function and a phase difference AF function.

Solution to Problem

According to an aspect of the present technology, there is provided a solid-state imaging device including: a pixel array unit including, as pixels including an on-chip lens, a photoelectric conversion unit, and a charge accumulation unit, imaging pixels for generating a captured image and phase difference detection pixels for performing phase difference detection arrayed therein; and a driving control unit configured to control driving of the pixels. The imaging pixel is formed with the charge accumulation unit shielded from light. The phase difference detection pixel is formed in a manner that at least part of at least one of the photoelectric conversion unit and the charge accumulation unit refrains from being shielded from light.

The driving control unit can read, in performing the phase difference detection, charge accumulated in at least part of at least one of the photoelectric conversion unit and the charge accumulation unit in the phase difference detection pixels, and perform, in generating the captured image, accumulation of charge in at least the imaging pixels simultaneously.

The phase difference detection pixel can include a light-shielding film that is provided with an opening in at least part of at least one of the photoelectric conversion unit and the charge accumulation unit. In a pair of the phase difference detection pixels, the openings can be provided in positions symmetrical to each other in a first direction in which the pair of phase difference detection pixels are arrayed, with respect to optical axes of the on-chip lenses.

The charge accumulation unit can be formed as a charge retention unit configured to retain charge from the photoelectric conversion unit.

The photoelectric conversion unit and the charge retention unit can be formed side by side in the first direction. The photoelectric conversion unit can be provided with the opening in one of the pair of phase difference detection pixels, and the charge retention unit can be provided with the opening in the other of the pair of phase difference detection pixels.

In performing the phase difference detection, the driving control unit can read charge accumulated in the photoelectric conversion unit in the one phase difference detection pixel, and read charge accumulated in the charge retention unit in the other phase difference detection pixel.

The driving control unit can control driving of the one phase difference detection pixel and the other phase difference detection pixel in a manner that a product of sensitivity of the photoelectric conversion unit and accumulation time in the one phase difference detection pixel becomes equal to a product of sensitivity of the charge retention unit and accumulation time in the other phase difference detection pixel.

The photoelectric conversion unit and the charge retention unit can be formed side by side in the first direction. Approximately half of the photoelectric conversion unit in the first direction can be provided with the opening in one of the pair of phase difference detection pixels, and the other approximately half of the photoelectric conversion unit in the first direction can be provided with the opening in the other of the pair of phase difference detection pixels.

In the pair of phase difference detection pixels, the photoelectric conversion units and the charge retention units can be formed in positions with mirror symmetry with respect to a boundary between the pair of phase difference detection pixels. In each of the pair of phase difference detection pixels, the photoelectric conversion unit can be provided with the opening.

The photoelectric conversion unit and the charge retention unit can be formed side by side in a second direction perpendicular to the first direction. Approximately half of the photoelectric conversion unit and the charge retention unit in the first direction can be provided with the opening in one of the pair of phase difference detection pixels, and the other approximately half of the photoelectric conversion unit and the charge retention unit in the first direction can be provided with the opening in the other of the pair of phase difference detection pixels.

In performing the phase difference detection, the driving control unit can read charge accumulated in the photoelectric conversion unit and the charge retention unit in the one phase difference detection pixel together, and read charge accumulated in the photoelectric conversion unit and the charge retention unit in the other phase difference detection pixel together.

In the phase difference detection pixel, the charge accumulation unit can be formed as another photoelectric conversion unit side by side with the photoelectric conversion unit in the first direction. The photoelectric conversion unit can be provided with the opening in one of the pair of phase difference detection pixels, and the other photoelectric conversion unit can be provided with the opening in the other of the pair of phase difference detection pixels.

In the phase difference detection pixel, the photoelectric conversion unit and the charge accumulation unit can be formed in positions symmetrical to each other in a predetermined direction, with respect to an optical axis of the on-chip lens. In performing the phase difference detection, the driving control unit can read charge accumulated in the photoelectric conversion unit in the phase difference detection pixel and charge accumulated in the charge retention unit in the phase difference detection pixel separately.

The charge accumulation unit can be formed as a charge retention unit configured to retain charge from the photoelectric conversion unit.

The phase difference detection pixel can include a light-shielding film that is provided with openings in part of the photoelectric conversion unit and the charge accumulation unit. The openings can be provided in positions symmetrical to each other in the predetermined direction, with respect to an optical axis of the on-chip lens.

The charge accumulation unit can be formed as a charge retention unit configured to retain charge from the photoelectric conversion unit. The phase difference detection pixel can include a transfer electrode configured to transfer charge from the photoelectric conversion unit to the charge retention unit above the charge retention unit. The transfer electrode can be formed using a transparent conductive film.

At least one of the imaging pixel and the phase difference detection pixel can share constituent elements among a plurality of pixels.

The constituent elements shared by the plurality of pixels can include at least one of a floating diffusion region, a reset transistor, an amplifier transistor, and a selection transistor.

According to an aspect of the present technology, there is provided a driving method of a solid-state imaging device, the solid-state imaging device including a pixel array unit including, as pixels including an on-chip lens, a photoelectric conversion unit, and a charge accumulation unit, imaging pixels for generating a captured image and phase difference detection pixels for performing phase difference detection arrayed therein, and a driving control unit configured to control driving of the pixels. The imaging pixel is formed with the charge accumulation unit shielded from light. The phase difference detection pixel is formed in a manner that at least part of at least one of the photoelectric conversion unit and the charge accumulation unit refrains from being shielded from light. The driving method includes the steps of: reading, in the phase difference detection performed by the solid-state imaging device, charge accumulated in at least part of at least one of the photoelectric conversion unit and the charge accumulation unit in the phase difference detection pixels; and performing, in generation of the captured image by the solid-state imaging device, accumulation of charge in at least the imaging pixels simultaneously.

According to an aspect of the present technology, there is provided an electronic apparatus including a solid-state imaging device including a pixel array unit including, as pixels including an on-chip lens, a photoelectric conversion unit, and a charge accumulation unit, imaging pixels for generating a captured image and phase difference detection pixels for performing phase difference detection arrayed therein, and a driving control unit configured to control driving of the pixels. The imaging pixel is formed with the charge accumulation unit shielded from light. The phase difference detection pixel is formed in a manner that at least part of at least one of the photoelectric conversion unit and the charge accumulation unit refrains from being shielded from light.

In an aspect of the present technology, as pixels including an on-chip lens, a photoelectric conversion unit, and a charge accumulation unit, imaging pixels for generating a captured image and phase difference detection pixels for performing phase difference detection are arrayed. The imaging pixel is formed with the charge accumulation unit shielded from light. The phase difference detection pixel is formed in a manner that at least part of at least one of the photoelectric conversion unit and the charge accumulation unit refrains from being shielded from light.

Advantageous Effects of Invention

According to an aspect of the present technology, it is possible to improve the precision of phase difference detection while suppressing deterioration of resolution in a solid-state imaging device having a global shutter function and a phase difference AF function.

DESCRIPTION OF EMBODIMENT(S)

Hereinafter, an embodiment of the present technology will be described with reference to the drawings.

[Examples of Function and Configuration of Electronic Apparatus]

Figure 1:
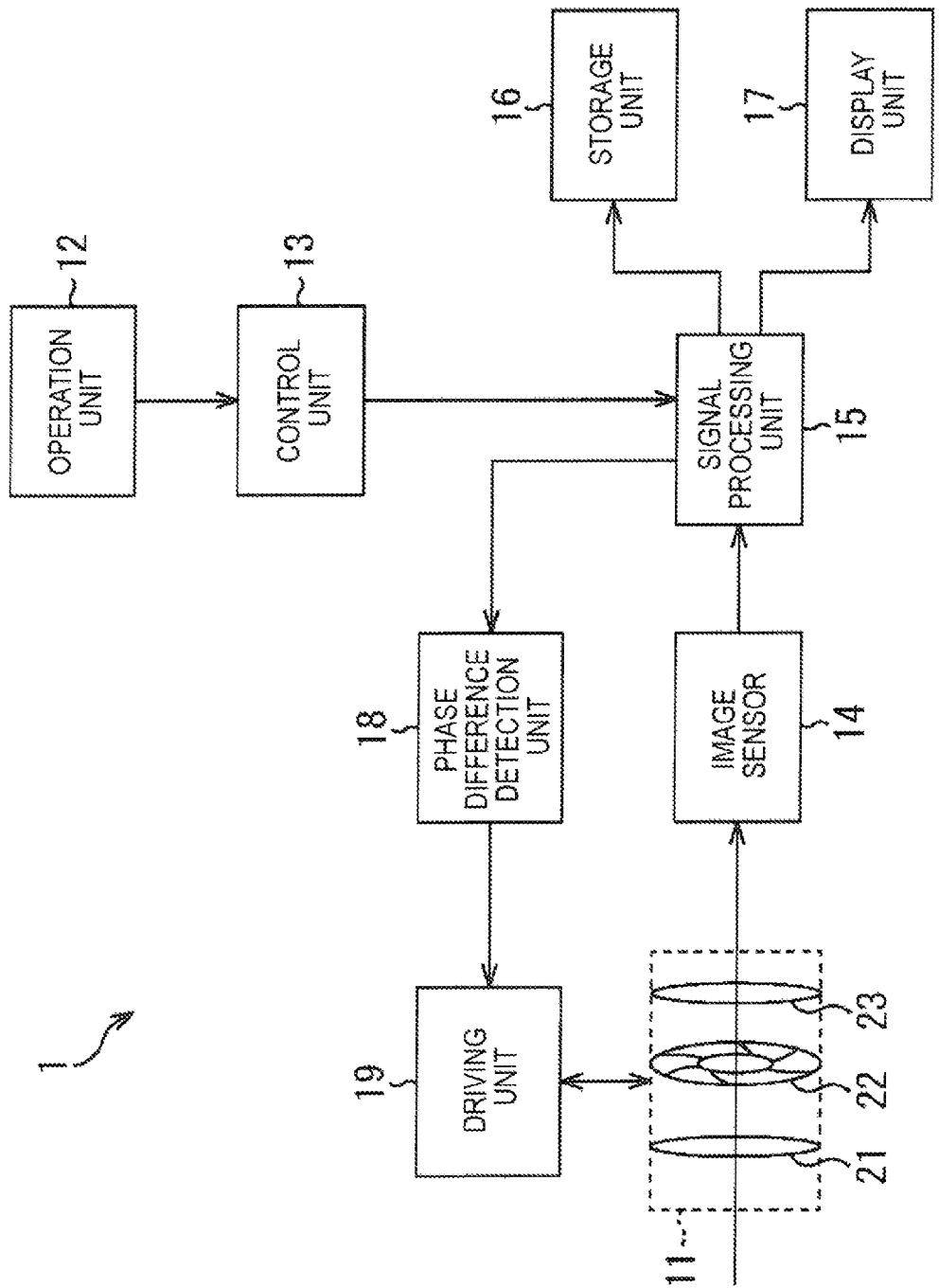
FIG. 1 is a block diagram illustrating an embodiment of an electronic apparatus including an image sensor to which the present technology is applied.

FIG. 1 is a block diagram illustrating an embodiment of an electronic apparatus including an image sensor to which the present technology is applied.

An electronic apparatus 1 of FIG. 1, which is configured as a digital camera, a portable terminal with an imaging function, or the like, captures images of an object to generate captured images by an auto focus (AF) function, and records the captured images as still images or moving images. The following description assumes that still images are mainly recorded.

The electronic apparatus 1 includes a lens unit 11, an operation unit 12, a control unit 13, an image sensor 14, a signal processing unit 15, a storage unit 16, a display unit 17, a phase difference detection unit 18, and a driving unit 19.

The lens unit 11 collects light (object light) from an object. The object light collected by the lens unit 11 enters the image sensor 14.

The lens unit 11 includes a zoom lens 21, a diaphragm 22, and a focus lens 23.

The zoom lens 21 changes a focal length by being driven by the driving unit 19 to move in an optical axis direction, thereby adjusting the magnification of an object included in a captured image. The diaphragm 22 changes the degree of aperture by being driven by the driving unit 19, thereby adjusting the amount of object light that enters the image sensor 14. The focus lens 23 is driven by the driving unit 19 to move in an optical axis direction, thereby adjusting focus.

The operation unit 12 receives an operation from a user. For example, when a shutter button (not illustrated) has been pushed, the operation unit 12 supplies an operation signal indicating the push to the control unit 13.

The control unit 13 controls the operation of each component of the electronic apparatus 1.

For example, when having received the operation signal indicating the push of the shutter button, the control unit 13 supplies an instruction to record a still image to the signal processing unit 15. In the case of displaying a live-view image, which is a real-time image of an object, on the display unit 17, the control unit 13 supplies an instruction to generate a live-view image to the signal processing unit 15.

In the case of performing focusing determination by a phase difference detection method, the control unit 13 supplies an instruction to carry out operation (phase difference detection operation) of performing focusing determination to the signal processing unit 15. The phase difference detection method detects a focus in the following manner: light that has passed through an imaging lens is subjected to pupil division to form a pair of images, and the distance between the formed images (the amount of deviation between the images) is measured (phase difference is detected) so that the degree of focusing is detected.

The image sensor 14 is a solid-state imaging device that photoelectrically converts received object light to electrical signals.

For example, the image sensor 14 is implemented by a complementary metal oxide semiconductor (CMOS) image sensor, a charge coupled device (CCD) image sensor, or the like. In a pixel array unit of the image sensor 14 are arranged, as a plurality of pixels, pixels (imaging pixels) that generate signals for generating a captured image on the basis of received object light and pixels (phase difference detection pixels) that generate signals for performing phase difference detection. The image sensor 14 supplies the electrical signals generated by photoelectric conversion to the signal processing unit 15.

The signal processing unit 15 performs various kinds of signal processing on the electrical signals supplied from the image sensor 14.

For example, when the instruction to record a still image has been supplied from the control unit 13, the signal processing unit 15 generates data (still image data) of the still image, performs black level correction, defect correction, shading correction, color mixture correction, and the like, and supplies the resulting data to the storage unit 16. When the instruction to generate a live-view image has been supplied from the control unit 13, the signal processing unit 15 generates data (live-view image data) of the live-view image on the basis of output signals from the imaging pixels in the image sensor 14, performs black level correction, defect correction, shading correction, color mixture correction, and the like, and supplies the resulting data to the display unit 17.

When the instruction to carry out phase difference detection operation has been supplied from the control unit 13, the signal processing unit 15 generates data (phase difference detection data) for detecting phase difference, on the basis of output signals from the phase difference detection pixels in the image sensor 14, and supplies the data to the phase difference detection unit 18.

The storage unit 16 records image data supplied from the signal processing unit 15. The storage unit 16 is configured as, for example, one or more removable recording media, such as a disc (e.g., a digital versatile disc (DVD)) and a semiconductor memory (e.g., a memory card). Such recording media may be incorporated in the electronic apparatus 1 or may be detachable from the electronic apparatus 1.

The display unit 17 displays an image on the basis of image data supplied from the signal processing unit 15. For example, when live-view image data has been supplied from the signal processing unit 15, the display unit 17 displays a live-view image. The display unit 17 is implemented by, for example, a liquid crystal display (LCD), an organic electro-luminescence (EL) display, or the like.

The phase difference detection unit 18 calculates the amount (defocus amount) of focus deviation on the basis of phase difference detection data supplied from the signal processing unit 15, thereby determining whether focusing is obtained with respect to an object targeted for focusing (focusing target). When an object in a focus area is focused, the phase difference detection unit 18 supplies, as a focusing determination result, information indicating that focusing is obtained to the driving unit 19. When the focusing target is not focused, the phase difference detection unit 18 supplies, as a focusing determination result, information indicating the calculated defocus amount to the driving unit 19.

The driving unit 19 drives the zoom lens 21, the diaphragm 22, and the focus lens 23. For example, the driving unit 19 calculates the driving amount of the focus lens 23 on the basis of the focusing determination result supplied from the phase difference detection unit 18, and moves the focus lens 23 in accordance with the calculated driving amount.

Specifically, when focusing is obtained, the driving unit 19 keeps the focus lens 23 at the current position. When focusing is not obtained, the driving unit 19 calculates the driving amount (movement distance) on the basis of the focusing determination result indicating the defocus amount and the position of the focus lens 23, and moves the focus lens 23 in accordance with the driving amount.

[Example Configuration of Image Sensor]

Figure 2:
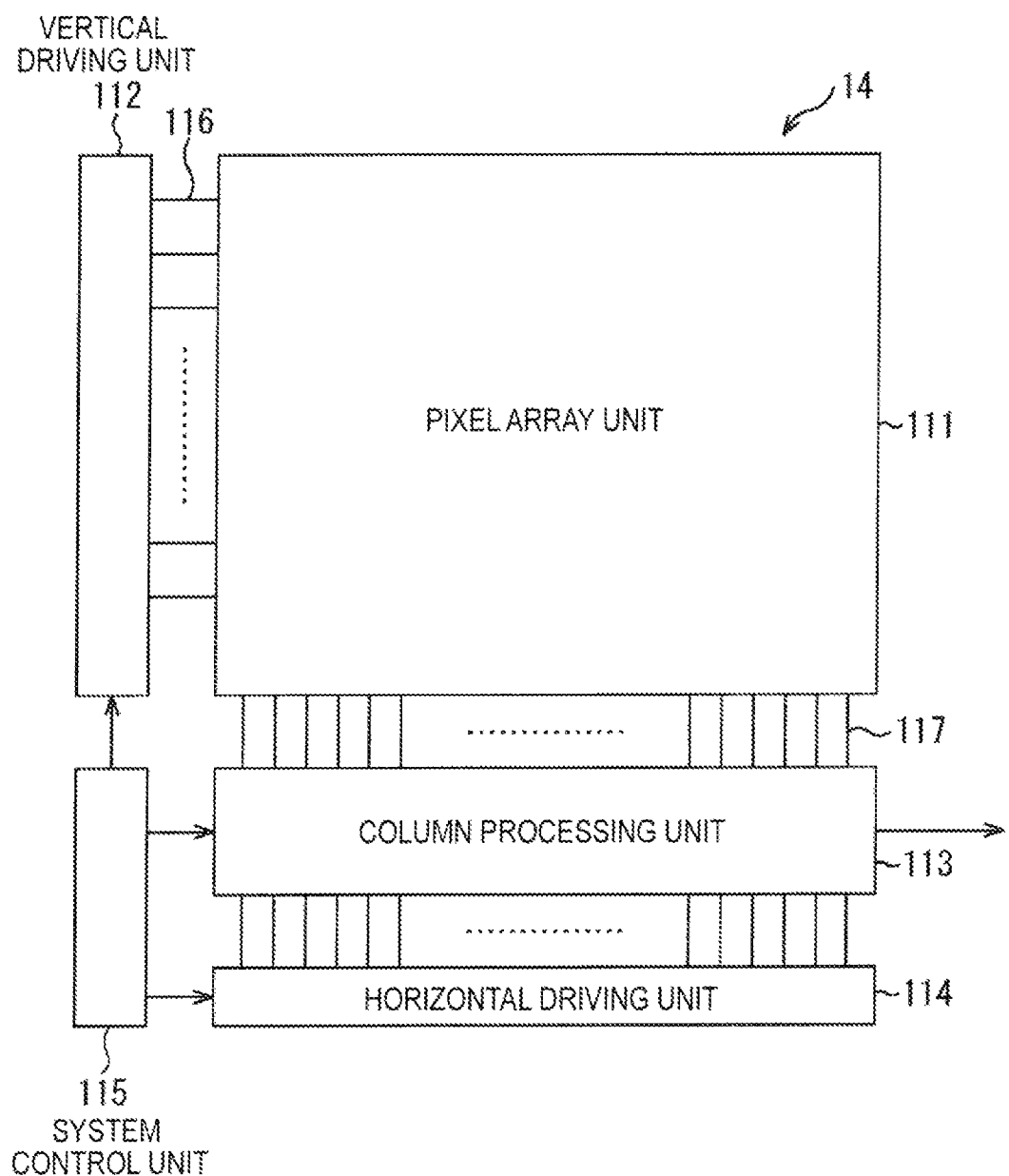
FIG. 2 is a block diagram illustrating an example configuration of an image sensor.

FIG. 2 is a block diagram illustrating an example configuration of the image sensor 14.

The image sensor 14 includes a pixel array unit 111, a vertical driving unit 112, a column processing unit 113, a horizontal driving unit 114, and a system control unit 115. The pixel array unit 111, the vertical driving unit 112, the column processing unit 113, the horizontal driving unit 114, and the system control unit 115 are formed on a semiconductor substrate (chip) (not illustrated).

In the pixel array unit 111, the above-described imaging pixels and phase difference detection pixels are two-dimensionally arranged in a matrix. In the following description, the imaging pixels and the phase difference detection pixels are also simply called "pixels".

Furthermore, pixel driving lines 116 are formed in the respective rows along the left-right direction of the figure (the array direction of the pixels of the pixel rows) and vertical signal lines 117 are formed in the respective columns along the up-down direction of the figure (the array direction of the pixels of the pixel columns) for the pixel array in a matrix in the pixel array unit 111. One terminal of the pixel driving line 116 is connected to an output terminal corresponding to each row of the vertical driving unit 112.

The vertical driving unit 112 includes a shift register, an address decoder, or the like, and is a pixel driving unit that drives the pixels in the pixel array unit 111 simultaneously for all the pixels, in units of rows, or the like by driving signals. Although a specific configuration of the vertical driving unit 112 is not illustrated, the vertical driving unit 112 includes two scanning systems, a read scanning system and a sweep scanning system.

The read scanning system selectively scans the pixels in the pixel array unit 111 sequentially in units of rows to read signals from the pixels. In row driving (rolling shutter operation), as for sweeping, sweep scanning is performed on the read row to be subjected to read scanning by the read scanning system, earlier than the read scanning by a period of time corresponding to a shutter speed. In global exposure (global shutter operation), collective sweeping is performed earlier than collective transfer by a period of time corresponding to a shutter speed.

This sweeping sweeps (resets) unnecessary charge from photoelectric conversion elements of the pixels of the read row. By sweeping (resetting) unnecessary charge, so-called electronic shutter operation is performed. Here, electronic shutter operation refers to operation of discarding charge of photoelectric conversion elements and newly starting exposure (starting accumulation of charge).

Signals read by the reading operation by the read scanning system correspond to the amount of light that has entered after the previous reading operation or electronic shutter operation. In row driving, a period from the previous read timing by reading operation or sweep timing by electronic shutter operation to the present read timing by reading operation serves as accumulation time of charge (an exposure period) in the pixels. In global exposure, a period from collective sweeping to collective transfer serves as accumulation time (an exposure period).

Pixels signals output from the pixels of the pixel row selectively scanned by the vertical driving unit 112 are supplied to the column processing unit 113 through the respective vertical signal lines 117. The column processing unit 113 performs predetermined signal processing on the pixel signal output from the pixel of the selected row through the vertical signal line 117 for each pixel column of the pixel array unit 111, and temporarily retains or supplies, to the signal processing unit 15 (FIG. 1), the pixel signals after the signal processing.

Specifically, the column processing unit 113 performs at least denoising processing, for example, correlated double sampling (CDS) processing, as the signal processing. This CDS processing by the column processing unit 113 removes reset noise and pixel-specific fixed pattern noise, such as threshold variation of amplifier transistors. In addition to the denoising processing, the column processing unit 113 may have an analog/digital (A/D) conversion function, for example, and output signals levels by digital signals.

The horizontal driving unit 114 includes a shift register, an address decoder, or the like, and sequentially selects unit circuits corresponding to the pixel columns of the column processing unit 113. By this selective scanning by the horizontal driving unit 114, the pixel signals having been subjected to the signal processing by the column processing unit 113 are sequentially output to a signal processing unit 118.

The system control unit 115 includes a timing generator, which generates various timing signals, or the like, and performs driving control of the vertical driving unit 112, the column processing unit 113, the horizontal driving unit 114, and the like on the basis of the various timing signals generated by the timing generator.

[Pixel Arrangement of Pixel Array Unit]

Next, the pixel arrangement of the pixel array unit 111 is described with reference to FIG. 3.

Figure 3:
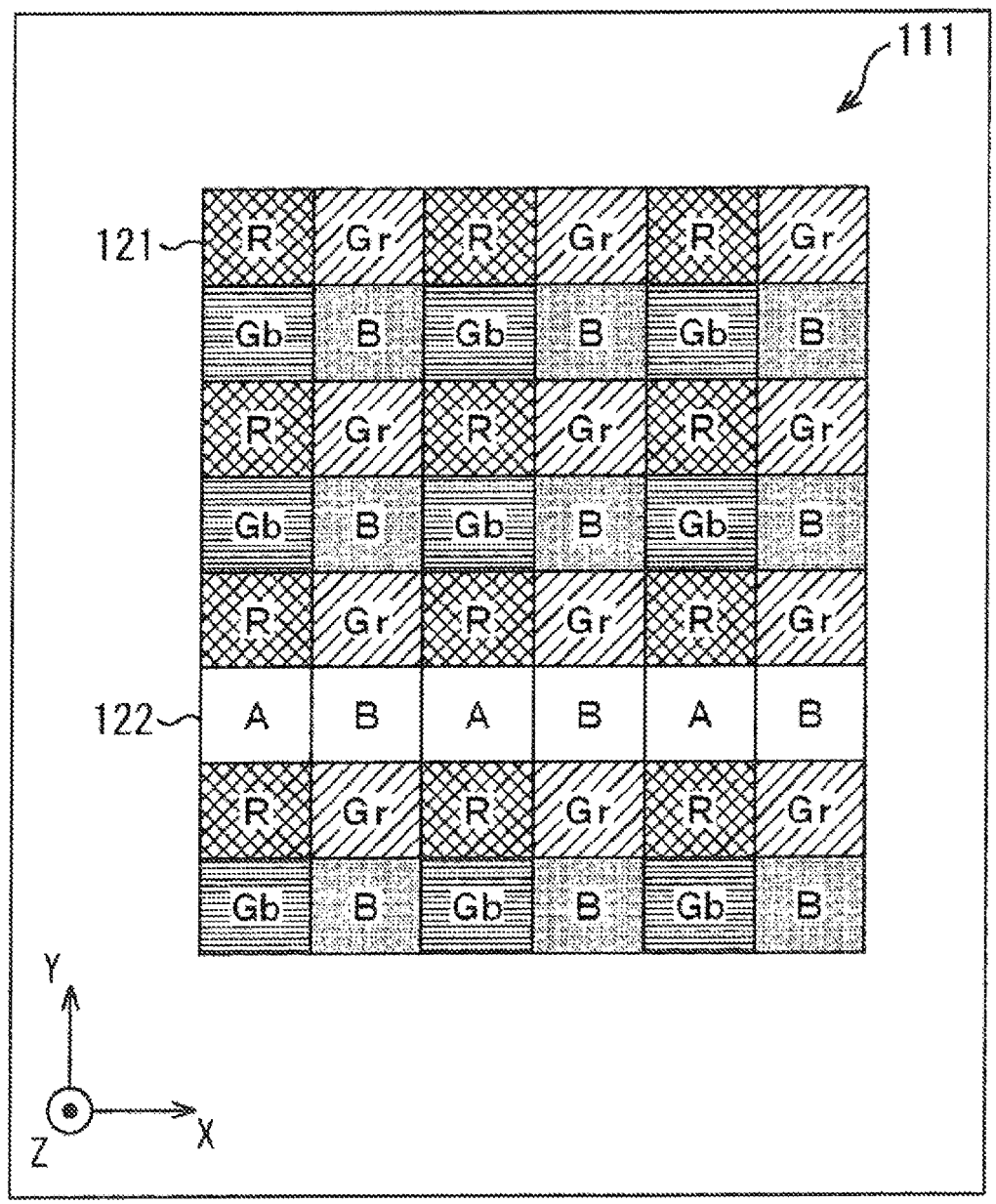
FIG. 3 illustrates an example of the pixel arrangement of an image sensor.

In FIG. 3, a direction from left toward right (row direction) is called X direction, a direction from bottom toward top (column direction) is called Y direction, and a direction from rear to front is called Z direction.

As illustrated in FIG. 3, in the pixel array unit 111, a plurality of imaging pixels 121 are two-dimensionally arranged in a matrix on an XY plane. The imaging pixels 121 include R pixels, G pixels, and B pixels, which are regularly arranged in a Bayer array.

In addition, in the pixel array unit 111, a plurality of phase difference detection pixels 122 are arranged among the plurality of imaging pixels 121 two-dimensionally arranged in a matrix. Specifically, the phase difference detection pixels 122 include an A pixel whose light-receiving region is shielded from light on the right side in the X direction and a B pixel whose light-receiving region is shielded from light on the left side in the X direction. These pixels replace part of the imaging pixels 121 in a predetermined row among the pixel rows in the pixel array unit 111 to be regularly arranged in a specific pattern (in FIG. 3, the A pixels and the B pixels are arranged alternately).

Note that the arrangement of the imaging pixels 121 and the phase difference detection pixels 122 in the pixel array unit 11 is not limited to the arrangement illustrated in FIG. 3, and arrangement in another pattern may be adopted. For example, the A pixels and the B pixels may be arranged in a width of two rows of the pixel array unit 111. Alternatively, the phase difference detection pixels 122 may include an A pixel whose light-receiving region is shielded from light on the upper side in the Y direction and a B pixel whose light-receiving region is shielded from light on the lower side in the Y direction, and those pixels may be arranged in the Y direction (column direction).

[Imaging Processing of Electronic Apparatus]

Here, imaging processing by the electronic apparatus 1 is described with reference to the flowchart of FIG. 4.

Figure 4:
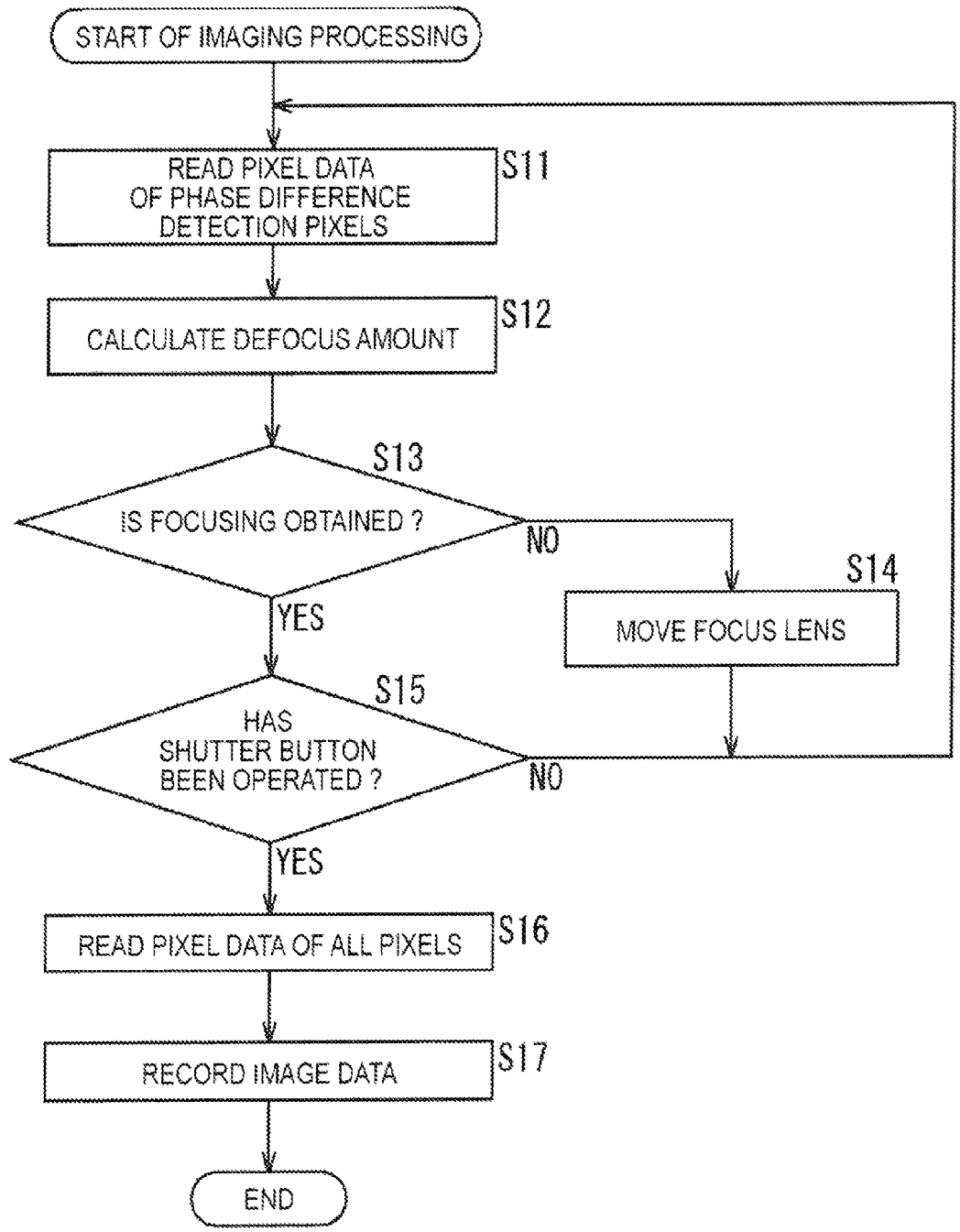
FIG. 4 is a flowchart illustrating imaging processing by an electronic apparatus.

The imaging processing of FIG. 4 starts when a power switch of the electronic apparatus 1 is turned on. At this time, a live-view image, luminance information obtained by photometry by a photometry unit (not illustrated), or the like is displayed on the display unit 17.

In step S11, the signal processing unit 15 reads pixel data (output signals) of the phase difference detection pixels 122 from the image sensor 14. At this time, pixel data of the A pixels and pixel data of the B pixels of the phase difference detection pixels 122 may be read simultaneously or may be read at different timings. The signal processing unit 15 generates phase difference detection data on the basis of the read output signals, and supplies the phase difference detection data to the phase difference detection unit 18.

In step S12, the phase difference detection unit 18 calculates a defocus amount on the basis of the phase difference detection data supplied from the signal processing unit 15.

In step S13, the phase difference detection unit 18 determines whether the absolute value of the calculated defocus amount is smaller than a predetermined value, thereby determining whether focusing is obtained with respect to a focusing target.

When it is determined that focusing is not obtained in step S13, the phase difference detection unit 18 supplies, as a focusing determination result, information indicating the calculated defocus amount to the driving unit 19, and the processing proceeds to step S14.

In step S14, the driving unit 19 calculates a driving amount (movement distance) on the basis of the focusing determination result indicating the defocus amount and the current position of the focus lens 23, and moves the focus lens 23 in accordance with the driving amount. Then, the processing returns to step S11, and the subsequent processing is repeated.

When it is determined that focusing is obtained in step S13, the phase difference detection unit 18 supplies, as a focusing determination result, information indicating that focusing is obtained to the driving unit 19, and the processing proceeds to step S15. At this time, the driving unit 19 keeps the focus lens 23 at the current position.

In step S15, the operation unit 12 determines whether the shutter button has been operated. When it is determined that the shutter button has not been operated in step S15, the processing returns to step S11, and the subsequent processing is repeated.

When it is determined that the shutter button has been operated in step S15, the processing proceeds to step S16, and the signal processing unit 15 reads pixel data (output signals) of all the pixels from the image sensor 14. At this time, at least the pixel data of the imaging pixels 121 is read row by row after the accumulation and retention of charge are performed simultaneously. Then, the signal processing unit 15 generates still image data on the basis of the read output signals, performs black level correction, defect correction, shading correction, color mixture correction, and the like, and, in step S17, stores the resulting data in the storage unit 16.

The above processing makes it possible to obtain an image that has simultaneity maintained owing to a global shutter function and is free from defocus owing to a phase difference AF function.

The configuration and operation of the imaging pixels 121 and the phase difference detection pixels 122 in the pixel array unit 111, which allow the global shutter function and the phase difference AF function to be both implemented as described above, are detailed below.

[Example Configuration of Imaging Pixel]

Figure 5:
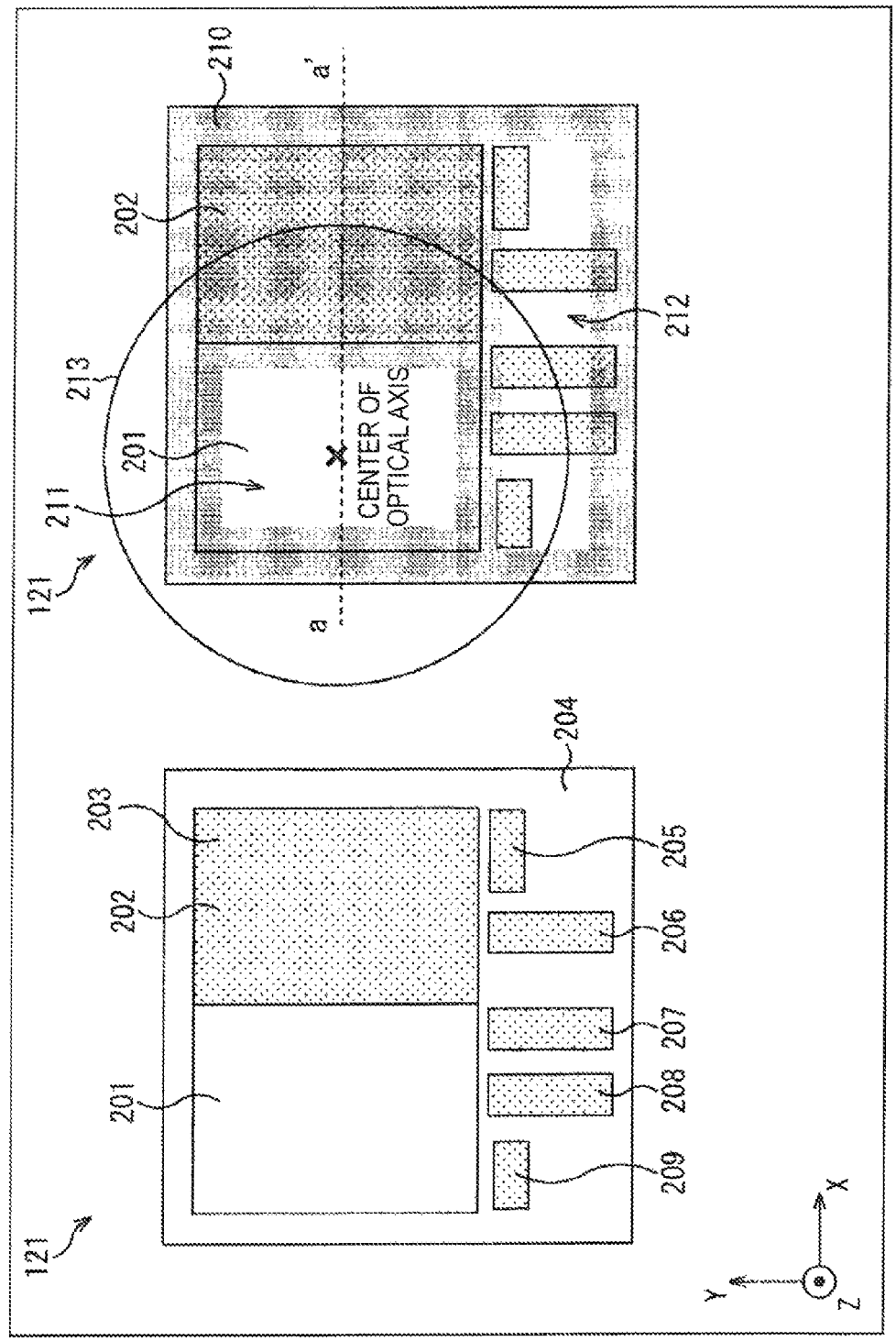
FIG. 5 is a top view of an example configuration of an imaging pixel.
Figure 6:
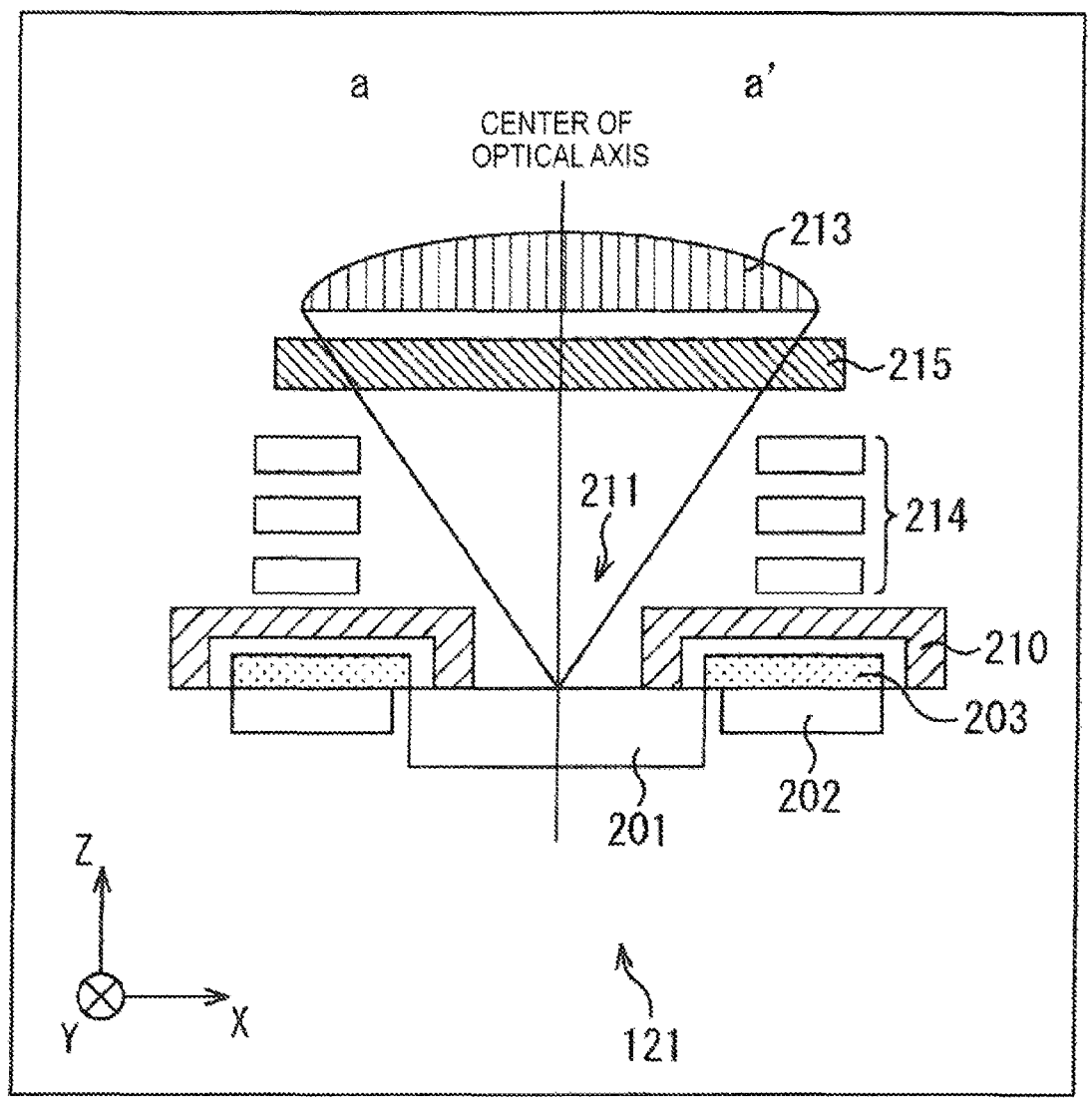
FIG. 6 is a cross-sectional view of the imaging pixel illustrated in FIG. 5.

First, an example configuration of the imaging pixel 121 is described with reference to FIGS. 5 and 6. FIG. 5 is a top view of the imaging pixel 121, and FIG. 6 is a cross-sectional view of the imaging pixel 121 along the broken line a-a' of the right side of FIG. 5.

As illustrated on the left side of FIG. 5, the imaging pixel 121 includes a photodiode (PD) 201, a memory unit (MEM) 202, a first transfer gate 203, a floating diffusion region (FD)

204, a second transfer gate 205, a reset transistor 206, an amplifier transistor 207, a selection transistor 208, and a charge discharging unit 209.

The photodiode 201 is formed in the following manner, for example: in a P-type well layer formed in an N-type substrate, an N-type buried layer is buried with a P-type layer formed on the substrate surface side.

The memory unit 202 is formed as a charge accumulation unit of the present technology, and functions as a charge retention unit that retains charge. The photodiode 201 and the memory unit 202 are formed side by side in the X direction (row direction).

The first transfer gate 203 includes a gate electrode made of polysilicon and an insulating film. The first transfer gate 203 is formed to cover a space between the photodiode 201 and the memory unit 202 and an upper portion of the memory unit 202 with the insulating film located therebetween, and transfers charge accumulated in the photodiode 201 to the memory unit 202 by application of a driving signal TRX to the gate electrode via a contact (not illustrated).

The second transfer gate 205 includes a gate electrode made of polysilicon and an insulating film. The second transfer gate 205 is formed to cover a space between the memory unit 202 and the floating diffusion region 204 with the insulating film located therebetween, and transfers charge accumulated in the memory unit 202 to the floating diffusion region 204 by application of a driving signal TRG to the gate electrode via a contact (not illustrated).

The reset transistor 206 is connected between a power source (not illustrated) and the floating diffusion region 204, and resets the floating diffusion region 204 by application of a driving signal RST to a gate electrode.

The amplifier transistor 207, whose drain electrode is connected to the power source (not illustrated) and whose gate electrode is connected to the floating diffusion region 204, reads the voltage of the floating diffusion region 204.

The selection transistor 208, whose drain electrode is connected to a source electrode of the amplifier transistor 207 and whose source electrode is connected to a vertical signal line 116 (FIG. 2), for example, selects a pixel from which a pixel signal is to be read by application of a driving signal SEL to a gate electrode.

The charge discharging unit 209 discharges charge accumulated in the photodiode 201 to a drain of an N-type layer by application of a driving signal OFG to a gate electrode at the time of exposure start.

In addition, as illustrated on the right side of FIG. 5, the imaging pixel 121 includes a light-shielding film 210 made of tungsten (W), for example. The light-shielding film 210 is formed to shield the memory unit 202 from light. The light-shielding film 210 is provided with an opening 211 for allowing the photodiode 201 to receive light (object light) and an opening 212 for connecting the gate electrodes of the second transfer gate 205 to the charge discharging unit 209 to wiring 214 (FIG. 6) with contacts.

Furthermore, the imaging pixel 121 includes an on-chip lens 213 in the uppermost layer. The on-chip lens 213 is formed such that its optical axis coincides with the center of the opening 211 (a light-receiving region of the photodiode 201).

Note that, as illustrated in FIG. 6, a color filter 215 having spectral properties corresponding to an R pixel, a G pixel, or a B pixel is formed below the on-chip lens 213 in the imaging pixel 121.

[Example Configuration of Phase Difference Detection Pixel]

Figure 7:
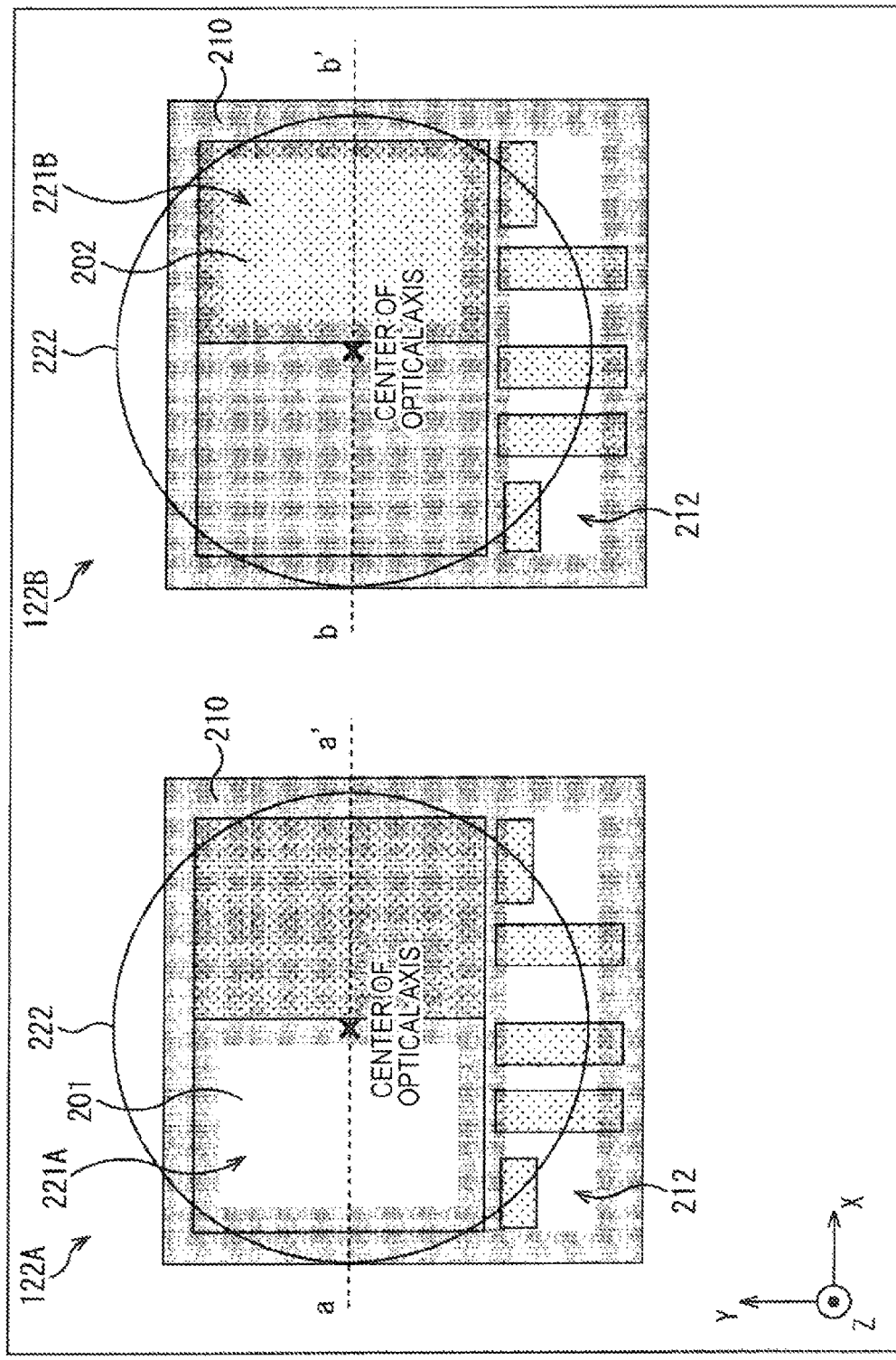
FIG. 7 is a top view of an example configuration of phase difference detection pixels.
Figure 8:
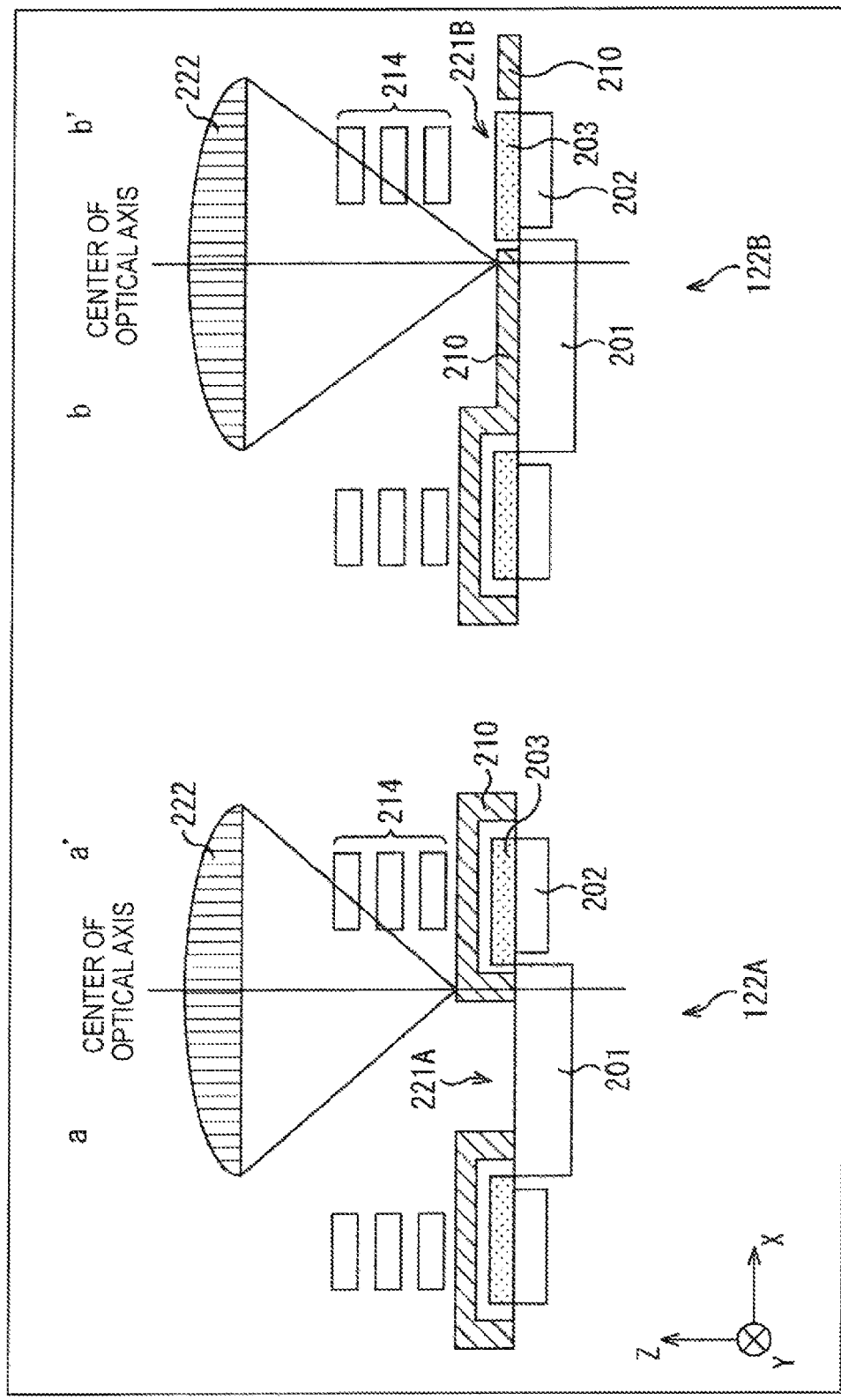
FIG. 8 is a cross-sectional view of the phase difference detection pixels illustrated in FIG. 7.

Next, an example configuration of the phase difference detection pixel 122 is described with reference to FIGS. 7 and 8. FIG. 7 shows top views of the phase difference detection pixel 122A (A pixel) whose right side is shielded from light and the phase difference detection pixel 122B (B pixel) whose left side is shielded from light among the phase difference detection pixels 122. FIG. 8 shows cross-sectional views of the phase difference detection pixels 122A and 122B along the broken lines a-a' and b-b' of FIG. 7.

Note that description is omitted regarding parts of the phase difference detection pixels 122A and 122B illustrated in FIGS. 7 and 8 and the imaging pixel 121 described with reference to FIGS. 5 and 6 that are formed in a similar manner.

In the phase difference detection pixel 122A, the light-shielding film 210 is formed to shield the memory unit 202 from light and is provided with an opening 221A for allowing the photodiode 201 to receive light. In the phase difference detection pixel 122B, the light-shielding film 210 is formed to shield the photodiode 201 from light and is provided with an opening 221B for allowing the memory unit 202 to receive light.

The opening 221A and the opening 221B preferably have the same shape.

An on-chip lens 222 is formed in the same position in each of the phase difference detection pixels 122A and 122B. Specifically, in the phase difference detection pixels 122A and 122B, the on-chip lenses 222 are formed in positions is where the distance between an optical axis of the on-chip lens 222 and a side of the opening 221A on the right side (the memory unit 202 side) in the phase difference detection pixel 122A becomes equal to the distance between an optical axis of the on-chip lens 222 and a side of the opening 221B on the left side (the photodiode 201 side) in the phase difference detection pixel 122B.

That is, in the pair of phase difference detection pixels 122 (122A and 122B), the openings 221A and 221B of the light-shielding film 210 are provided in positions symmetrical to each other in the X direction in which the phase difference detection pixels 122A and 122B are arrayed, with respect to the optical axes of the on-chip lenses 222.

Note that the position of the on-chip lens 222 in the phase difference detection pixel 122 is different from the position of the on-chip lens 213 in the imaging pixel 121; however, the size of the on-chip lens 222 in the phase difference detection pixel 122 is preferably the same as the size of the on-chip lens 213 in the imaging pixel 121.

As illustrated in FIG. 8, a color filter is not formed below the on-chip lens 222 in the phase difference detection pixel 122.

With the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Next, the operation of the imaging pixel 121 and the phase difference detection pixels 122A and 122B is described.

[Operation of Imaging Pixel]

First, the operation of the imaging pixel 121 is described with reference to FIG. 9. The operation (driving) of the imaging pixel 121 described with reference to FIG. 9 is performed when a captured image is generated.

Figure 9:
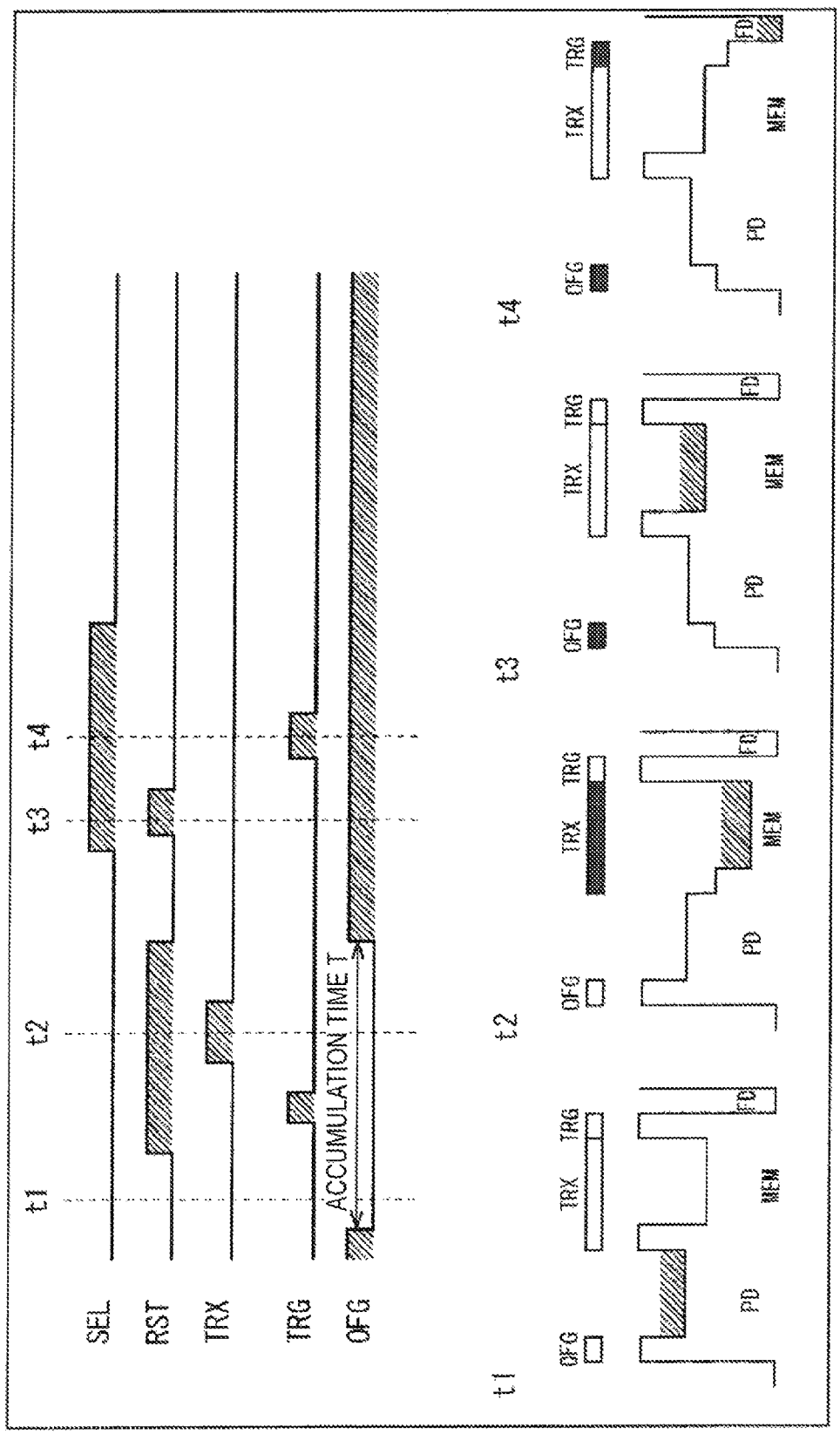
FIG. 9 illustrates the operation of an imaging pixel.

The upper stage of FIG. 9 shows a timing chart of driving signals applied to the selection transistor 208, the reset transistor 206, the first transfer gate 203, the second transfer gate 205, and the charge discharging unit 209 of the imaging pixel 121.

The lower stage of FIG. 9 shows potential diagrams of the imaging pixel 121 at times t1 to t4 in the timing chart in the upper stage of FIG. 9.

At time t1, charge corresponding to incident light amount is accumulated in the photodiode (PD) 201 in all the imaging pixels 121.

After that, in a state where all the driving signals are off, the driving signal RST is turned on, and the driving signal TRG is turned on. Then, at time t2, when the driving signal TRX is turned on, charge accumulated in the photodiode 201 is transferred to the memory unit (MEM) 202.

After that, the driving signal TRX is turned off, so that charge is retained in the memory unit 202. Then, the driving signal RST is turned off and the driving signal OFG is turned on. As illustrated in the timing chart in the upper stage of FIG. 9, a period during which the driving signal OFG is off is accumulation time T in the imaging pixel 121.

At time t3, when the driving signals SEL and RST are turned on, the photodiode 201 is brought into a state where no charge is accumulated therein.

At time 14, when the driving signal TRG is turned on, charge retained in the memory unit 202 is transferred to the floating diffusion region (FD) 204.

The above operation makes it possible to perform, in generating a captured image, accumulation of charge in all the imaging pixels 121 simultaneously and thus allows implementation of the global shutter function.

[Operation of Phase Difference Detection Pixel (A Pixel)]

Next, the operation of the phase difference detection pixel 122A (A pixel) is described with reference to FIG. 10. The operation (driving) of the phase difference detection pixel 122A described with reference to FIG. 10 is performed when a captured image is generated and also performed when phase difference is detected.

Figure 10:
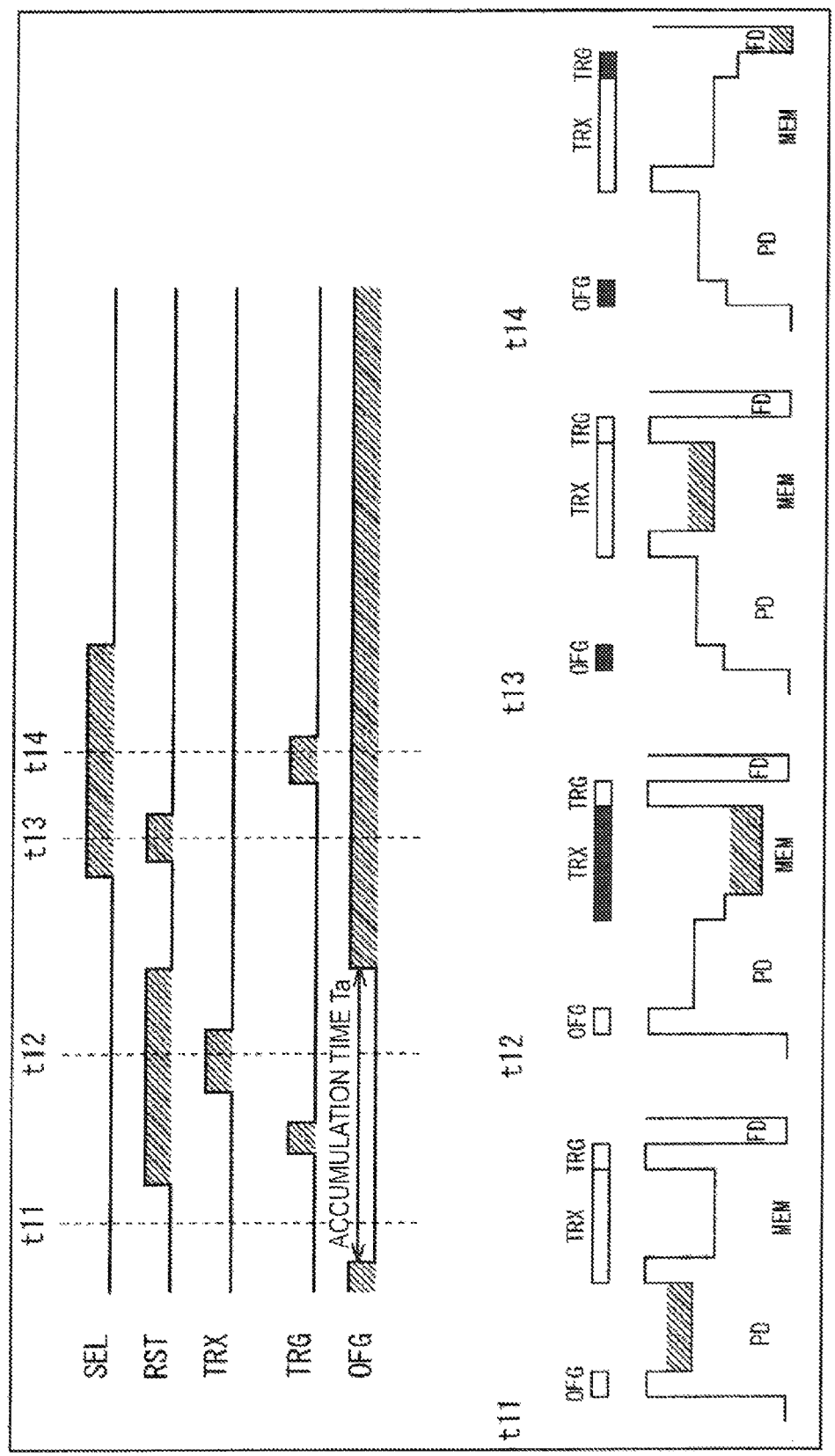
FIG. 10 illustrates the operation of a phase difference detection pixel.

The upper stage of FIG. 10 shows a timing chart of driving signals applied to the selection transistor 208, the reset transistor 206, the first transfer gate 203, the second transfer gate 205, and the charge discharging unit 209 of the phase difference detection pixel 122A.

The lower stage of FIG. 10 shows potential diagrams of the phase difference detection pixel 122A at times t11 to t14 in the timing chart in the upper stage of FIG. 10.

The operation of the phase difference detection pixel 122A illustrated in FIG. 10 is similar to the operation of the imaging pixel 121 described with reference to FIG. 9 and description thereof is omitted.

Note that accumulation time Ta in the phase difference detection pixel 122A illustrated in the timing chart in the upper stage of FIG. 10 may be the same as or different from the accumulation time T in the imaging pixel 121 illustrated in the timing chart in the upper stage of FIG. 9.

[Operation of Phase Difference Detection Pixel (B Pixel)]

Next, the operation of the phase difference detection pixel 122B (B pixel) is described with reference to FIG. 11. The operation (driving) of the phase difference detection pixel 122B described with reference to FIG. 11 also is performed when a captured image is generated and also performed when phase difference is detected.

Figure 11:
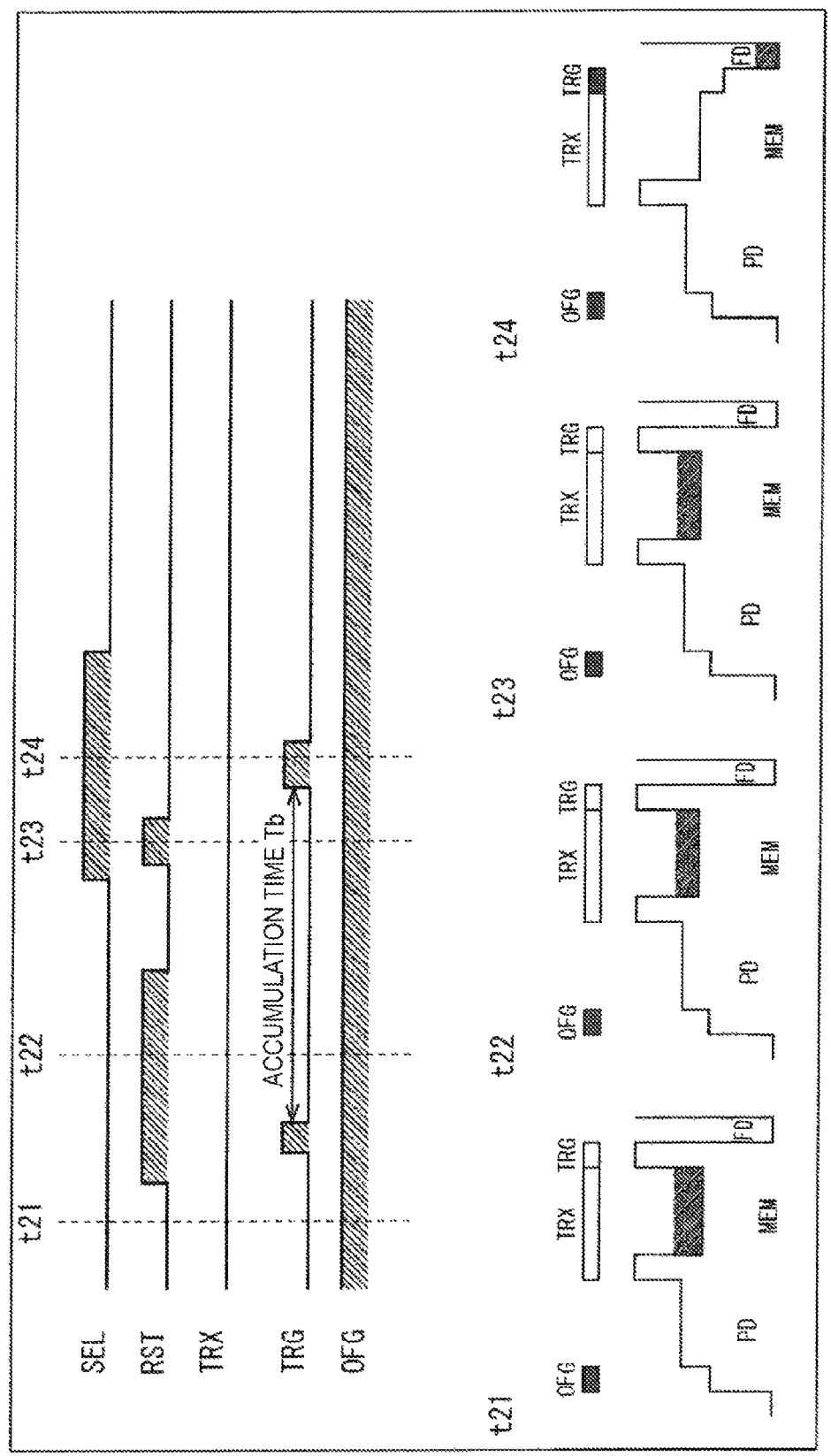
FIG. 11 illustrates the operation of a phase difference detection pixel.

The upper stage of FIG. 11 shows a timing chart of driving signals applied to the selection transistor 208, the reset transistor 206, the first transfer gate 203, the second transfer gate 205, and the charge discharging unit 209 of the phase difference detection pixel 122B.

The lower stage of FIG. 11 shows potential diagrams of the phase difference detection pixel 122B at times t21 to t24 in the timing chart in the upper stage of FIG. 11.

In a state where the driving signal OFG is always on, at time t21, charge corresponding to incident light amount is accumulated in the memory unit (MEM) 202. Because the driving signal OFG is always on, charge is not accumulated in the photodiode (PD) 201.

After that, when the driving signal RST is turned on and the driving signal TRG is turned on, charge accumulated in the memory unit 202 is reset.

At time t22, charge corresponding to incident light amount after the reset is accumulated in the memory unit 202.

After the driving signal RST is turned off, at time t23, when the driving signals SEL and RST are turned on, the floating diffusion region (FD) 204 is reset.

At time t24, when the driving signal TRG is turned on, charge accumulated in the memory unit 202 is transferred to the floating diffusion region 204. As illustrated in the timing chart in the upper stage of FIG. 11, a period between when the driving signal TRG is turned on to reset the memory unit 202 and when the driving signal TRG is turned on at time t24 is accumulation time Tb in the phase difference detection pixel 122B.

Note that times 121 to t24 in FIG. 11 can be the same as times t11 to t14 in FIG. 10, respectively.

The above operation makes it possible to perform, in performing phase difference detection, reading from the phase difference detection pixel 122A and reading from the phase difference detection pixel 122B simultaneously and thus allows implementation of the phase difference AF function while maintaining the simultaneity of the phase difference detection pixel 122A and the phase difference detection pixel 122B.

The accumulation time Ta in the phase difference detection pixel 122A and the accumulation time Tb in the phase difference detection pixel 122B can be set individually, and are preferably optimized depending on the sensitivity (output) of the respective pixels. Specifically, each accumulation time is set so that the product of the sensitivity of the phase difference detection pixel 122A and the accumulation time Ta becomes equal to the product of the sensitivity of the phase difference detection pixel 122B and the accumulation time Tb, that is, so that (the sensitivity of the phase difference detection pixel 122A)×(the accumulation time Ta)=(the sensitivity of the phase difference detection pixel 122B)×(the accumulation time Tb) is satisfied.

In this manner, signals used for phase difference detection can be made uniform in each of the pair of phase difference detection pixels and the precision of phase difference detection can be improved.

Hereinafter, modification examples of phase difference detection pixels will be described.

Modification Example 1

Example Configuration of Phase Difference Detection Pixel

Figure 12:
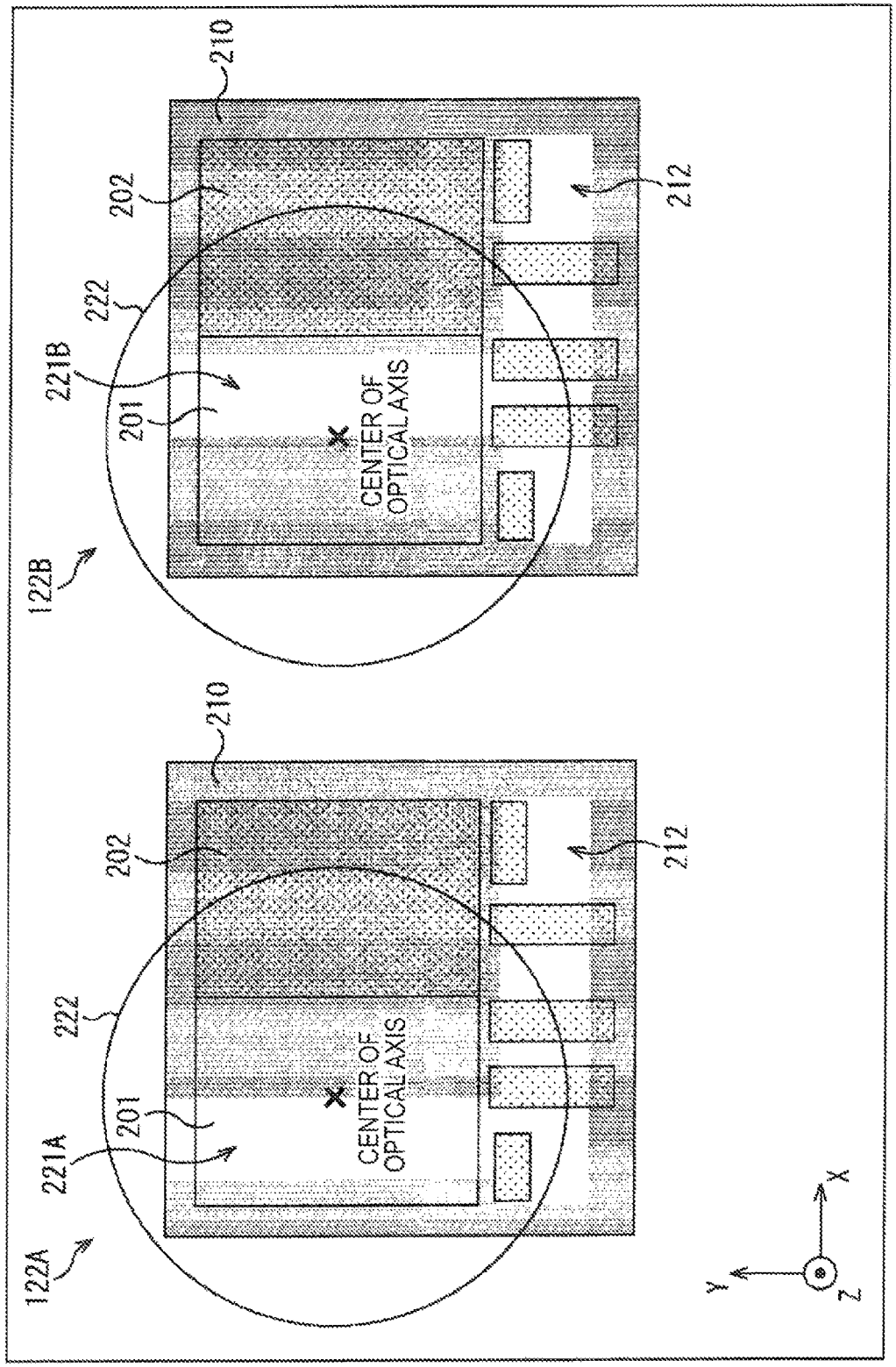
FIG. 12 is a top view of another example configuration (Modification example 1) of phase difference detection pixels.

FIG. 12 illustrates another example configuration of the phase difference detection pixel 122.

Note that description is omitted regarding parts of the phase difference detection pixels 122A and 122B illustrated in FIG. 12 and the phase difference detection pixels 122A and 122B illustrated in FIG. 7 that are formed in a similar manner.

As illustrated in FIG. 12, in the phase difference detection pixel 122A, approximately half of the photodiode 201 on the left side is provided with the opening 221A. In the phase difference detection pixel 122B, approximately half of the photodiode 201 on the right side is provided with the opening 221B.

Furthermore, as illustrated in FIG. 12, the openings 221A and 221B are formed so as to be long as possible in the Y direction. Specifically, the lengths of the openings 221A and 221B in the Y direction are set longer than the length of the opening 211 (FIG. 5) of the imaging pixel 121 in the Y direction.

The opening 221A and the opening 221B preferably have the same shape.

The on-chip lens 222 is formed in the same position in each of the phase difference detection pixels 122A and 122B. Specifically, in the phase difference detection pixels 122A and 122B, the on-chip lenses 222 are formed in positions where the distance between an optical axis of the on-chip lens 222 and a side of the opening 221A on the right side (the memory unit 202 side) in the phase difference detection pixel 122A becomes equal to the distance between an optical axis of the on-chip lens 222 and a side of the opening 221B on the left side (the photodiode 201 side) in the phase difference detection pixel 122B.

That is, in the pair of phase difference detection pixels 122A and 122B, the openings 221A and 221B of the light-shielding film 210 are provided in positions symmetrical to each other in the X direction in which the phase difference detection pixels 122A and 122B are arrayed, with respect to the optical axes of the on-chip lenses 222.

In each of the phase difference detection pixels 122A and 122B of FIG. 12, the on-chip lens 222 is formed such that its optical axis coincides with the center of the light-receiving region of the photodiode 201. That is, the positions of the on-chip lenses 222 in the phase difference detection pixels 122A and 122B of FIG. 12 are the same as the position of the on-chip lens 213 in the imaging pixel 121.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of each of the phase difference detection pixels 122A and 122B illustrated in FIG. 12 is similar to that described with reference to FIG. 10.

Modification Example 2

Example Configuration of Phase Difference Detection Pixel

Figure 13:
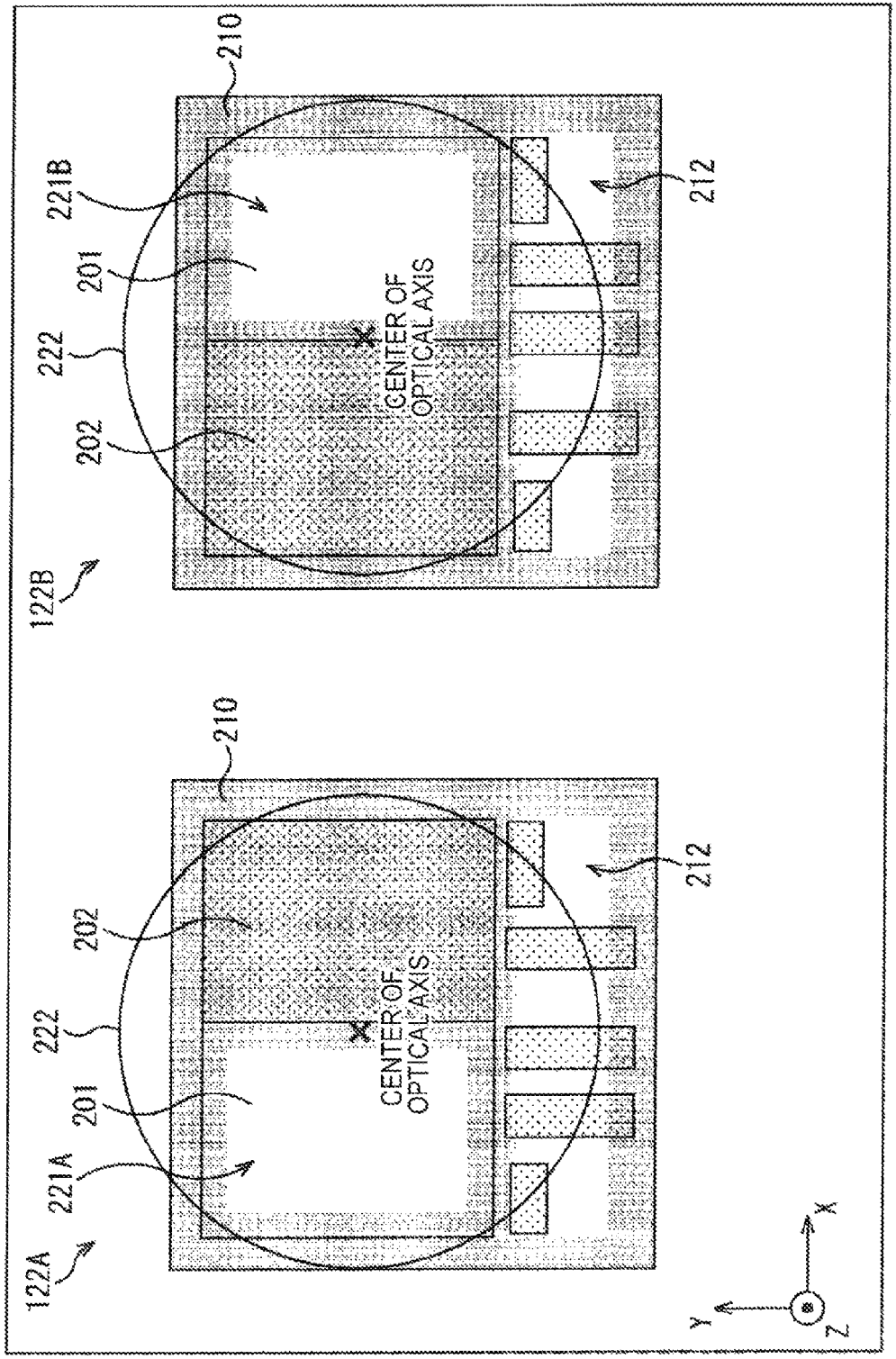
FIG. 13 is a top view of still another example configuration (Modification example 2) of phase difference detection pixels.

FIG. 13 illustrates still another example configuration of the phase difference detection pixel 122.

Note that description is omitted regarding parts of the phase difference detection pixels 122A and 122B illustrated in FIG. 13 and the phase difference detection pixels 122A and 122B illustrated in FIG. 7 that are formed in a similar manner.

In the phase difference detection pixels 122A and 122B illustrated in FIG. 13, the photodiodes 201 and the memory units 202 are formed in positions symmetrical to each other in the X direction. Specifically, while the photodiode 201 is formed on the left side and the memory unit 202 is formed on the right side in the phase difference detection pixel 122A, the memory unit 202 is formed on the left side and the photodiode 201 is formed on the right side in the phase difference detection pixel 122B.

As illustrated in FIG. 13, the phase difference detection pixel 122A is provided with the opening 221A for allowing the photodiode 201, which is formed on the left side of the phase difference detection pixel 122A, to receive light. The phase difference detection pixel 122B is provided with the opening 221B for allowing the photodiode 201, which is formed on the right side of the phase difference detection pixel 122B, to receive light.

The opening 221A and the opening 221B preferably have the same shape.

The on-chip lens 222 is formed in the same position in each of the phase difference detection pixels 122A and 122B. Specifically, in the phase difference 6 detection pixels 122A and 122B, the on-chip lenses 222 are formed in positions where the distance between an optical axis of the on-chip lens 222 and a side of the opening 221A on the right side (the memory unit 202 side) in the phase difference detection pixel 122A becomes equal to the distance between an optical axis of the on-chip lens 222 and a side of the opening 221B on the left side (the memory unit 202 side) in the phase difference detection pixel 122B.

That is, in the pair of phase difference detection pixels 122A and 122B, the openings 221A and 221B of the light-shielding film 210 are provided in positions symmetrical to each other in the X direction in which the phase difference detection pixels 122A and 122B are arrayed, with respect to the optical axes of the on-chip lenses 222.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of the phase difference detection pixels 122A and 122B illustrated in FIG. 13 is similar to that described with reference to FIG. 10.

Modification Example 3

Example Configuration of Phase Difference Detection Pixel

Figure 14:
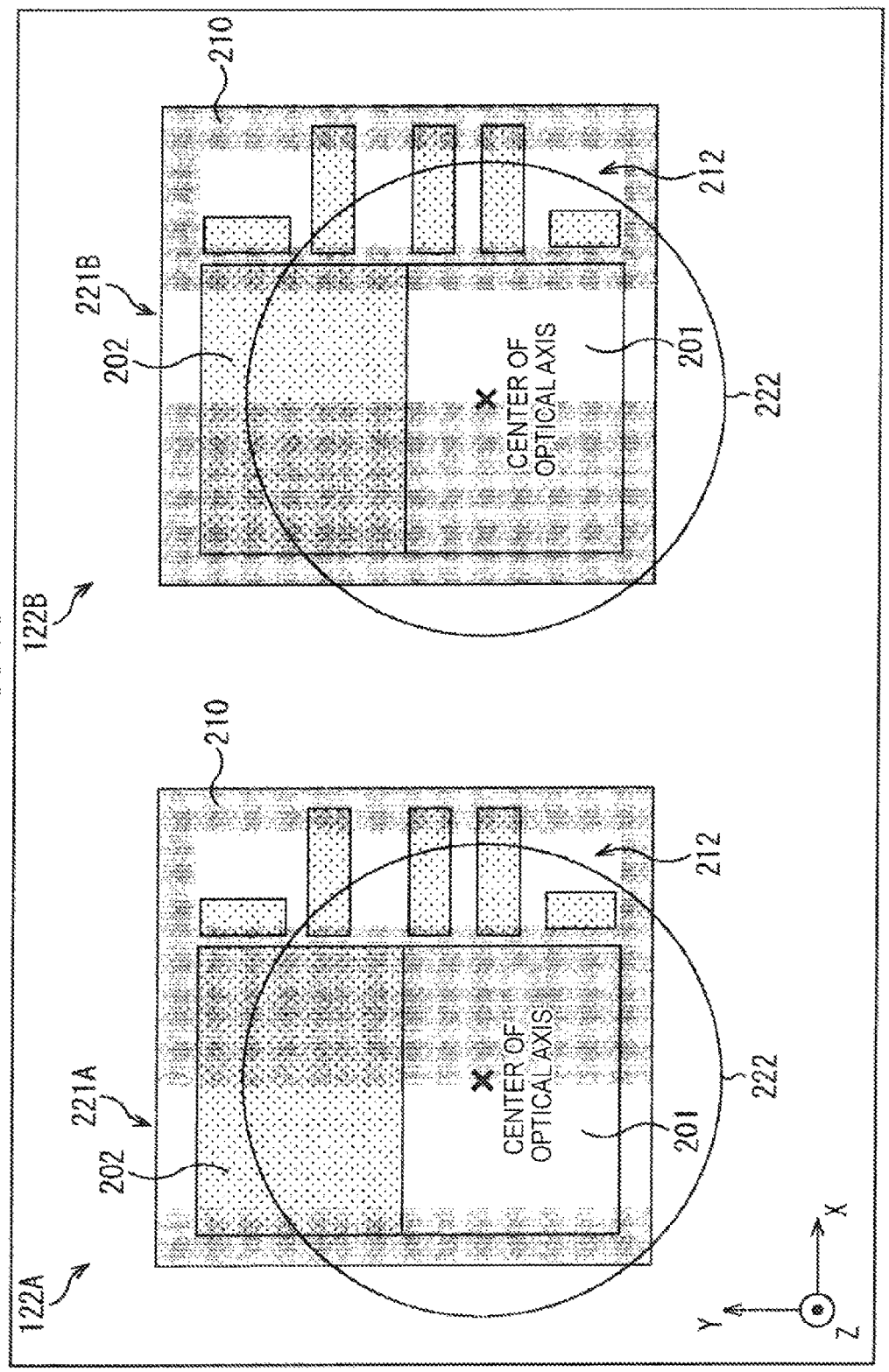
FIG. 14 is a top view of still another example configuration (Modification example 3) of phase difference detection pixels.

FIG. 14 illustrates still another example configuration of the phase difference detection pixel 122.

Note that description is omitted regarding parts of the phase difference detection pixels 122A and 122B illustrated in FIG. 14 and the phase difference detection pixels 122A and 122B illustrated in FIG. 7 that are formed in a similar manner.

In each of the phase difference detection pixels 122A and 122B illustrated in FIG. 14, the photodiode 201, the memory unit 202, and the like are formed to be in a state obtained by rotating the phase difference detection pixels 122A and 122B illustrated in FIG. 7 leftward by 90 degrees. That is, in the phase difference detection pixels 122A and 122B, the photodiode 201 and the memory unit 202 are formed side by side in the Y direction.

Note that in this example, also in the imaging pixel 121, the photodiode 201, the memory unit 202, and the opening 211 in the light-shielding film 210 are formed to be in a state obtained by rotating the imaging pixel 121 illustrated in FIG. 5 leftward by 90 degrees.

As illustrated in FIG. 14, in the phase difference detection pixel 122A, approximately half of each of the photodiode 201 and the memory unit 202 on the left side is provided with the opening 221A. In the phase difference detection pixel 122B, approximately half of each of the photodiode 201 and the memory unit 202 on the right side is provided with the opening 221B.

Furthermore, as illustrated in FIG. 14, the openings 221A and 221B are formed so as to be long as possible in the Y direction.

The opening 221A and the opening 221B preferably have the same shape.

The on-chip lens 222 is formed in the same position in each of the phase difference detection pixels 122A and 122B. Specifically, in the phase difference detection pixels 122A and 122B, the on-chip lenses 222 are formed in positions where the distance between an optical axis of the on-chip lens 222 and a side of the opening 221A on the right side in the phase difference detection pixel 122A becomes equal to the distance between an optical axis of the on-chip lens 222 and a side of the opening 221B on the left side in the phase difference detection pixel 122B.

That is, in the pair of phase difference detection pixels 122A and 122B, the openings 221A and 221B of the light-shielding film 210 are provided in positions symmetrical to each other in the X direction in which the phase difference detection pixels 122A and 122B are arrayed, with respect to the optical axes of the on-chip lenses 222.

In each of the phase difference detection pixels 122A and 122B of FIG. 14, the on-chip lens 222 is formed such that its optical axis coincides with the center of the light-receiving region of the photodiode 201. That is, the positions of the on-chip lenses 222 in the phase difference detection pixels 122A and 122B of FIG. 14 are the same as the position of the on-chip lens 213 in the imaging pixel 121.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Here, the operation of the imaging pixel 121 and the phase difference detection pixels 122A and 122B in this example is described. The driving of the imaging pixel 121 is similar to that described with reference to FIG. 9 and description thereof is omitted.

[Operation of Phase Difference Detection Pixel]

Next, the operation of the phase difference detection pixels 122A and 122B is described with reference to FIG. 15. In this example, the phase difference detection pixels 122A and 122B perform the same operation.

Figure 15:
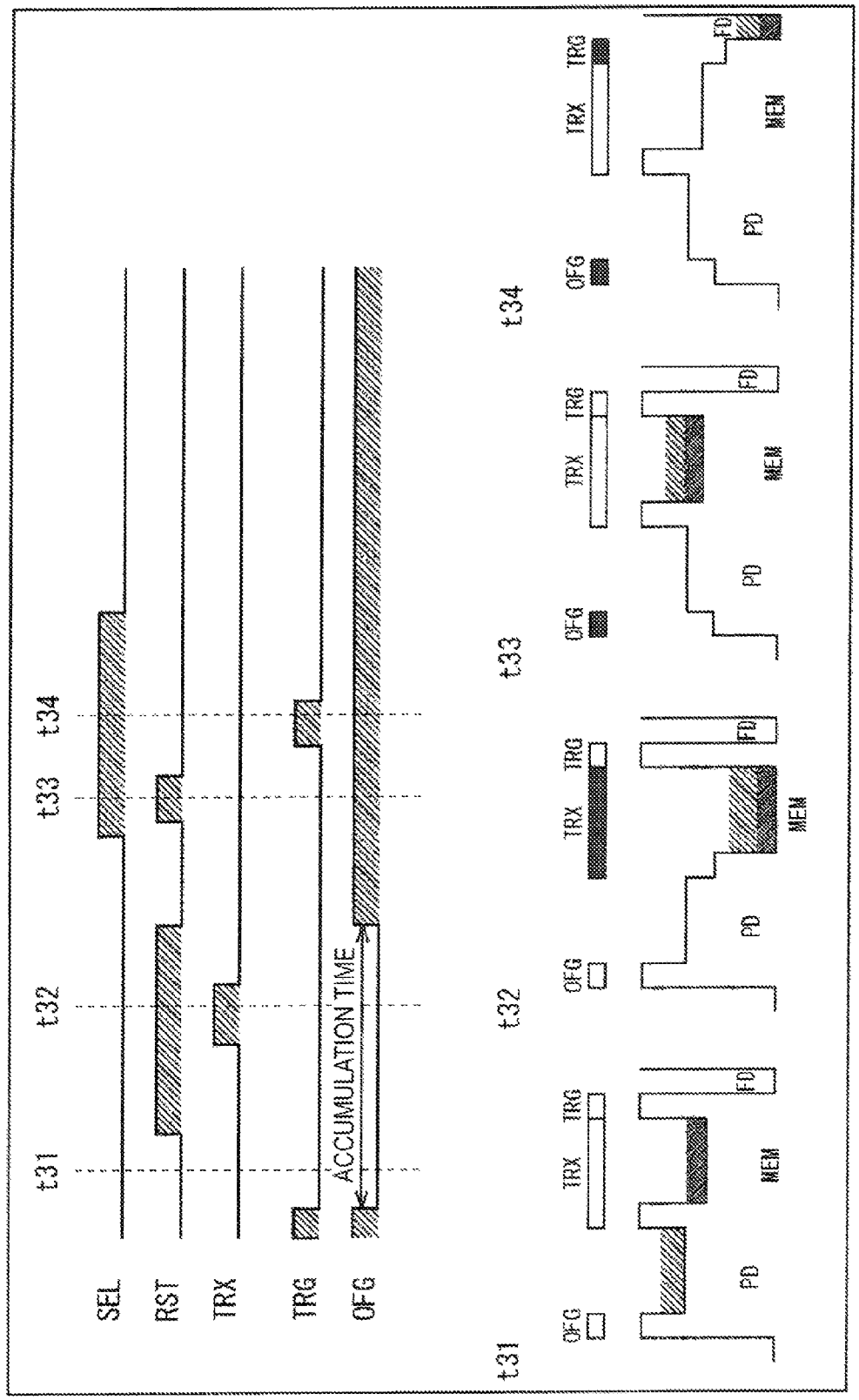
FIG. 15 illustrates the operation of phase difference detection pixels.

The upper stage of FIG. 15 shows a timing chart of driving signals applied to the selection transistor 208, the reset transistor 206, the first transfer gate 203, the second transfer gate 205, and the charge discharging unit 209 of the phase difference detection pixel 122 (122A and 122B).

The lower stage of FIG. 15 shows potential diagrams of the phase difference detection pixel 122 at times t31 to t34 in the timing chart in the upper stage of FIG. 15.

At time t31, charge corresponding to incident light amount is accumulated in each of the photodiode (PD) 201 and the memory unit (MEM) 202 in all the phase difference detection pixels 122.

After that, in a state where all the driving signals are off, the driving signal RST is turned on. Then, at time t32, when the driving signal TRX is turned on, charge accumulated in the photodiode 201 is transferred to the memory unit 202.

Note that since the driving signal TRG is not turned on between time t31 and time t32, charge of the memory unit 202 is not reset, and charge accumulated in the photodiode 201 and charge accumulated in the memory unit 202 are combined at time t32.

After that, the driving signal TRX is turned off, so that charge is retained in the memory unit 202. Then, the driving signal RST is turned off and the driving signal OFG is turned on. As illustrated in the timing chart in the upper stage of FIG. 15, a period during which the driving signal OFG is off is accumulation time in the phase difference detection pixel 122 of this example.

At time t33, when the driving signals SEL and RST are turned on, the photodiode 201 is brought into a state where no charge is accumulated therein.

At time t34, when the driving signal TRG is turned on, charge retained in the memory unit 202 is transferred to the floating diffusion region (FD) 204.

In this manner, in the phase difference detection pixel 122A, charge accumulated in the photodiode 201 and the memory unit 202, which are shielded from light on the right side, is read together, and in the phase difference detection pixel 122B, charge accumulated in the photodiode 201 and the memory unit 202, which are shielded from light on the left side, is read together.

The above operation also makes it possible to perform, in performing phase difference detection, reading from the phase difference detection pixel 122A and reading from the phase difference detection pixel 122B simultaneously and thus allows implementation of the phase difference AF function while maintaining the simultaneity of the phase difference detection pixel 122A and the phase difference detection pixel 122B.

Modification Example 4

Example Configuration of Phase Difference Detection Pixel

Figure 16:
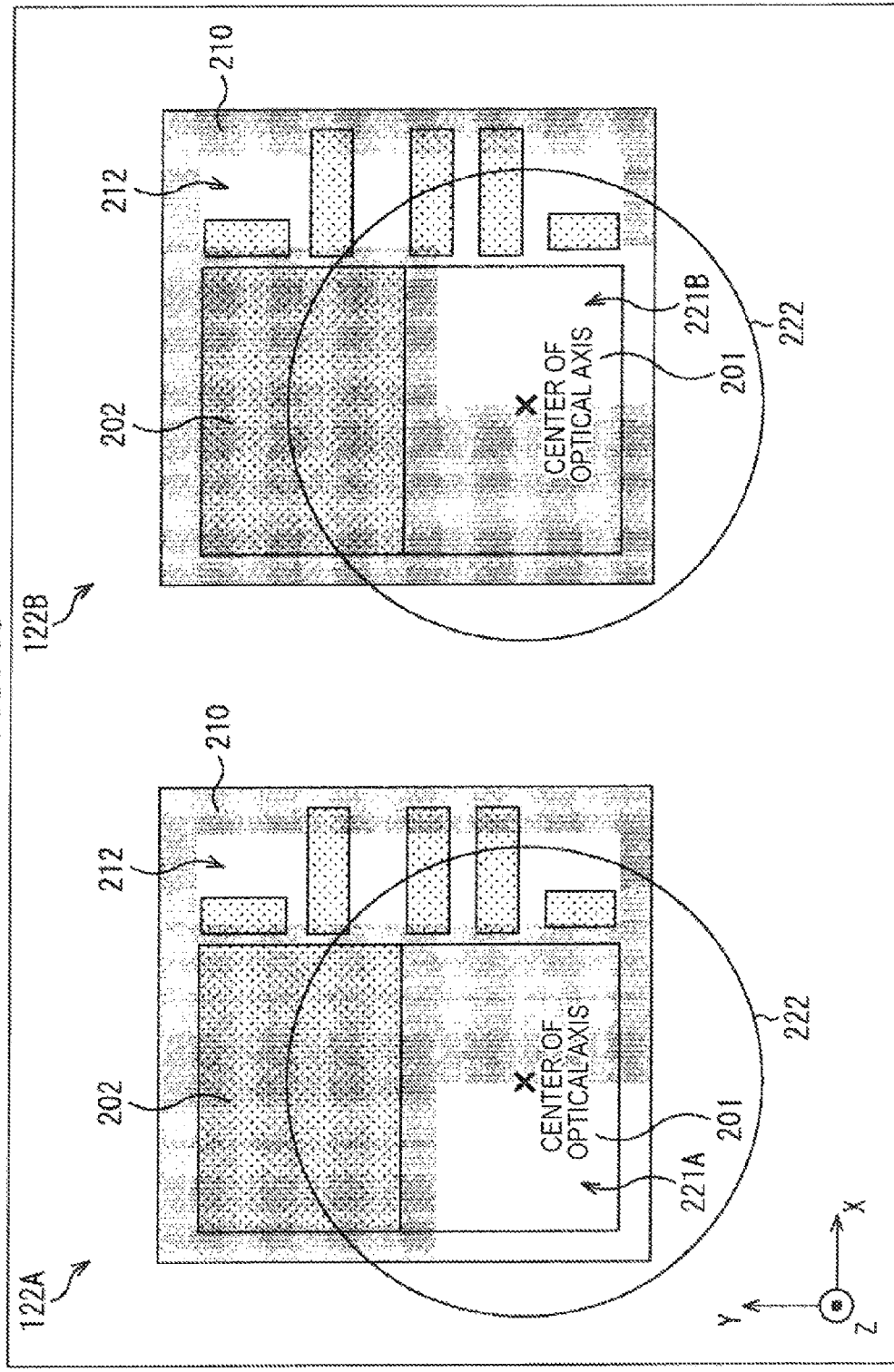
FIG. 16 is a top view of still another example configuration (Modification example 4) of phase difference detection pixels.

FIG. 16 illustrates still another example configuration of the phase difference detection pixel 122.

Note that description is omitted regarding parts of the phase difference detection pixels 122A and 122B illustrated in FIG. 16 and the phase difference detection pixels 122A and 122B illustrated in FIG. 7 that are formed in a similar manner.

In each of the phase difference detection pixels 122A and 122B illustrated in FIG. 16, the photodiode 201, the memory unit 202, and the like are formed to be in a state obtained by rotating the phase difference detection pixels 122A and 122B illustrated in FIG. 7 leftward by 90 degrees. That is, in the phase difference detection pixels 122A and 122B, the photodiode 201 and the memory unit 202 are formed side by side in the Y direction.

Note that in this example, also in the imaging pixel 121, the photodiode 201, the memory unit 202, and the opening 211 in the light-shielding film 210 are formed to be in a state obtained by rotating the imaging pixel 121 illustrated in FIG. 5 leftward by 90 degrees.

As illustrated in FIG. 16, in the phase difference detection pixel 122A, approximately half of the photodiode 201 on the left side is provided with the opening 221A. In the phase difference detection pixel 122B, approximately half of the photodiode 201 on the right side is provided with the opening 221B.

Furthermore, as illustrated in FIG. 16, the openings 221A and 221B are formed so as to be long as possible in the X direction and the Y direction. Specifically, the lengths of the openings 221A and 221B in the X direction are set longer than half the length of the opening 211 of the imaging pixel 121 in the X direction, and the lengths of the openings 221A and 221B in the Y direction are set longer than the length of the opening 211 of the imaging pixel 121 in the Y direction.

The on-chip lens 222 is formed in the same position in each of the phase difference detection pixels 122A and 122B. Specifically, in the phase difference detection pixels 122A and 122B, the on-chip lenses 222 are formed in positions where the distance between an optical axis of the on-chip lens 222 and a side of the opening 221A on the right side in the phase difference detection pixel 122A becomes equal to the distance between an optical axis of the on-chip lens 222 and a side of the opening 221B on the left side in the phase difference detection pixel 122B.

That is, in the pair of phase difference detection pixels 122A and 122B, the openings 221A and 221B of the light-shielding film 210 are provided in positions symmetrical to each other in the X direction in which the phase difference detection pixels 122A and 122B are arrayed, with respect to the optical axes of the on-chip lenses 222.

In each of the phase difference detection pixels 122A and 122B of FIG. 16, the on-chip lens 222 is formed such that its optical axis coincides with the center of the light-receiving region of the photodiode 201. That is, the positions of the on-chip lenses 222 in the phase difference detection pixels 122A and 122B of FIG. 16 are the same as the position of the on-chip lens 213 in the imaging pixel 121.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of each of the phase difference detection pixels 122A and 122B illustrated in FIG. 16 is similar to that described with reference to FIG. 10.

Modification Example 5

Example Configuration of Phase Difference Detection Pixel

Figure 17:
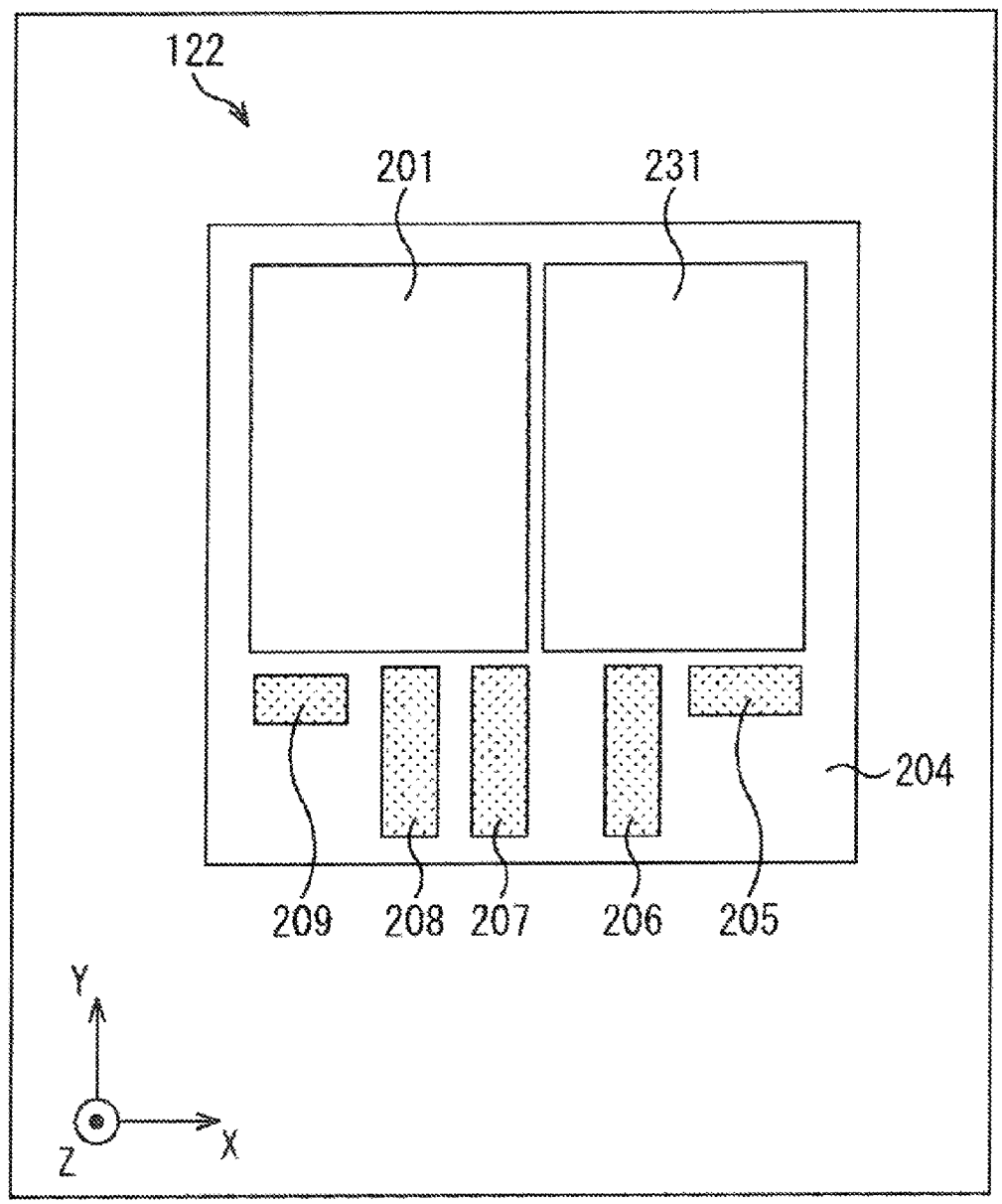
FIG. 17 is a top view of still another example configuration (Modification example 5) of phase difference detection pixels.
Figure 18:
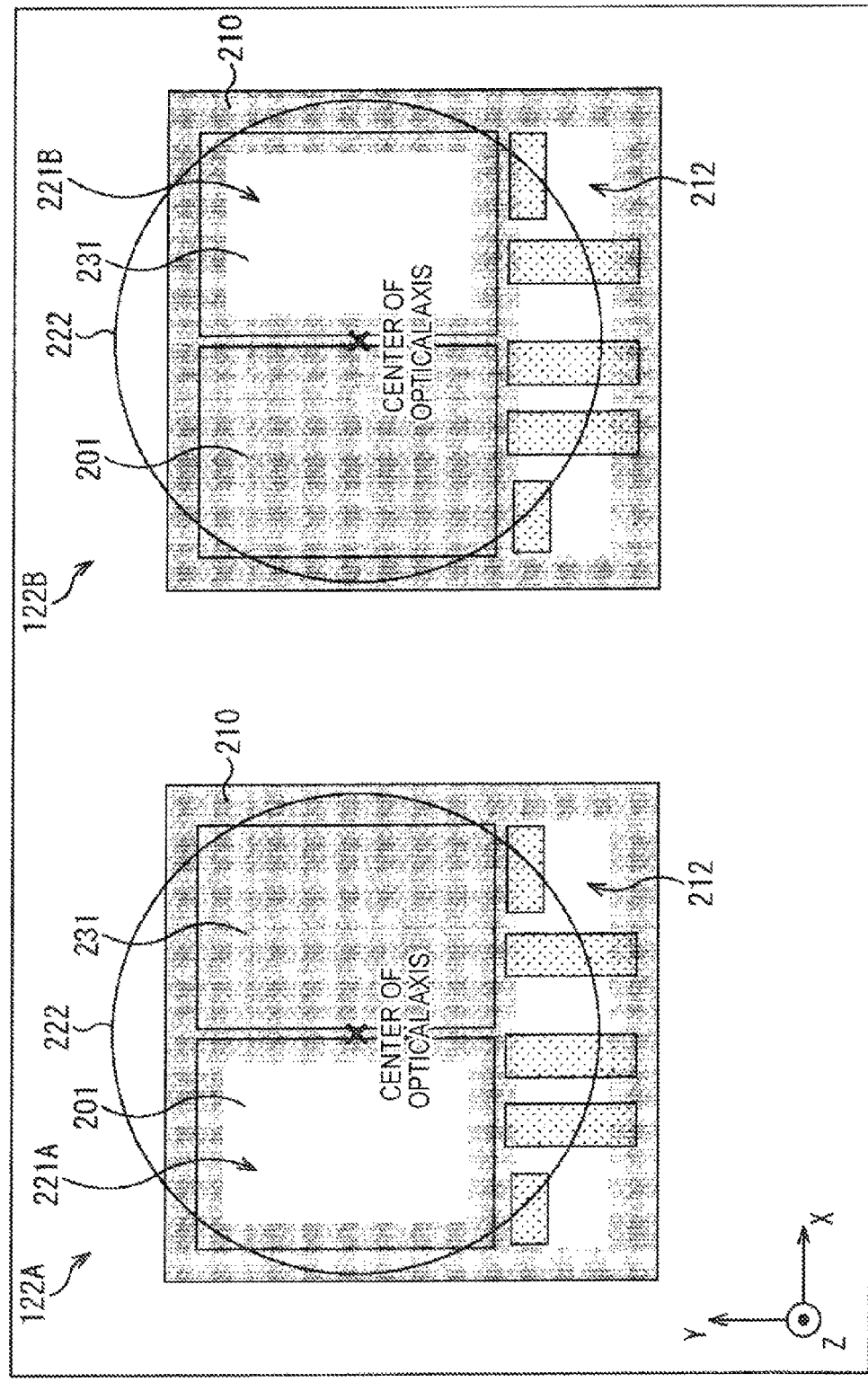
FIG. 18 is a top view of still another example configuration (Modification example 5) of phase difference detection pixels.

FIGS. 17 and 18 illustrate another example configuration of the phase difference detection pixel 122.

Note that description is omitted regarding parts of the phase difference detection pixel 122 (122A and 122B) illustrated in FIGS. 17 and 18 and the phase difference detection pixels 122A and 122B illustrated in FIG. 7 that are formed in a similar manner.

The phase difference detection pixel 122 of FIG. 17 differs from the phase difference detection pixels 122A and 122B of FIG. 7 in that a photodiode 231 is provided instead of the memory unit 202. The photodiode 231 is formed as a charge accumulation unit of the present technology, and functions as a photoelectric conversion unit that accumulates charge corresponding to incident light amount. As illustrated in FIG. 17, the photodiode 201 and the photodiode 231 are formed side by side in the X direction (row direction).

As described above, the phase difference detection pixel 122 does not include the memory unit 202 and therefore does not perform global shutter operation in this example. Note that the imaging pixel 121 has the configuration illustrated in FIG. 5 and includes the memory unit 202, therefore being able to perform global shutter operation.

As illustrated in FIG. 18, the phase difference detection pixel 122A is provided with the opening 221A for allowing the photodiode 201, which is placed on the left side, to receive light. The phase difference detection pixel 122B is provided with the opening 221B for allowing the photodiode 231, which is placed on the right side, to receive light.

The opening 221A and the opening 221B preferably have the same shape.

The on-chip lens 222 is formed in the same position in each of the phase difference detection pixels 122A and 122B. Specifically, in the phase difference detection pixels 122A and 122B, the on-chip lenses 222 are formed in positions where the distance between an optical axis of the on-chip lens 222 and a side of the opening 221A on the right side (the photodiode 231 side) in the phase difference detection pixel 122A becomes equal to the distance between an optical axis of the on-chip lens 222 and a side of the opening 221B on the left side (the photodiode 201 side) in the phase difference detection pixel 122B.

That is, in the pair of phase difference detection pixels 122A and 122B, the openings 221A and 221B of the light-shielding film 210 are provided in positions symmetrical to each other in the X direction in which the phase difference detection pixels 122A and 122B are arrayed, with respect to the optical axes of the on-chip lenses 222.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that as described above, the phase difference detection pixels 122A and 122B illustrated in FIG. 18 do not perform global shutter operation. Therefore, as their operation, rolling shutter operation of sequentially reading charge row by row or pixel by pixel is performed.

The above describes configurations in which phase difference detection is performed on the basis of output signals of each of the pair of phase difference detection pixels. The following describes a configuration in which one phase difference detection pixel has a function of a pair of phase difference detection pixels.

Modification Example 6

Pixel Arrangement of Pixel Array Unit

First, the pixel arrangement of the pixel array unit 111 of this example is described with reference to FIG. 19.

Figure 19:
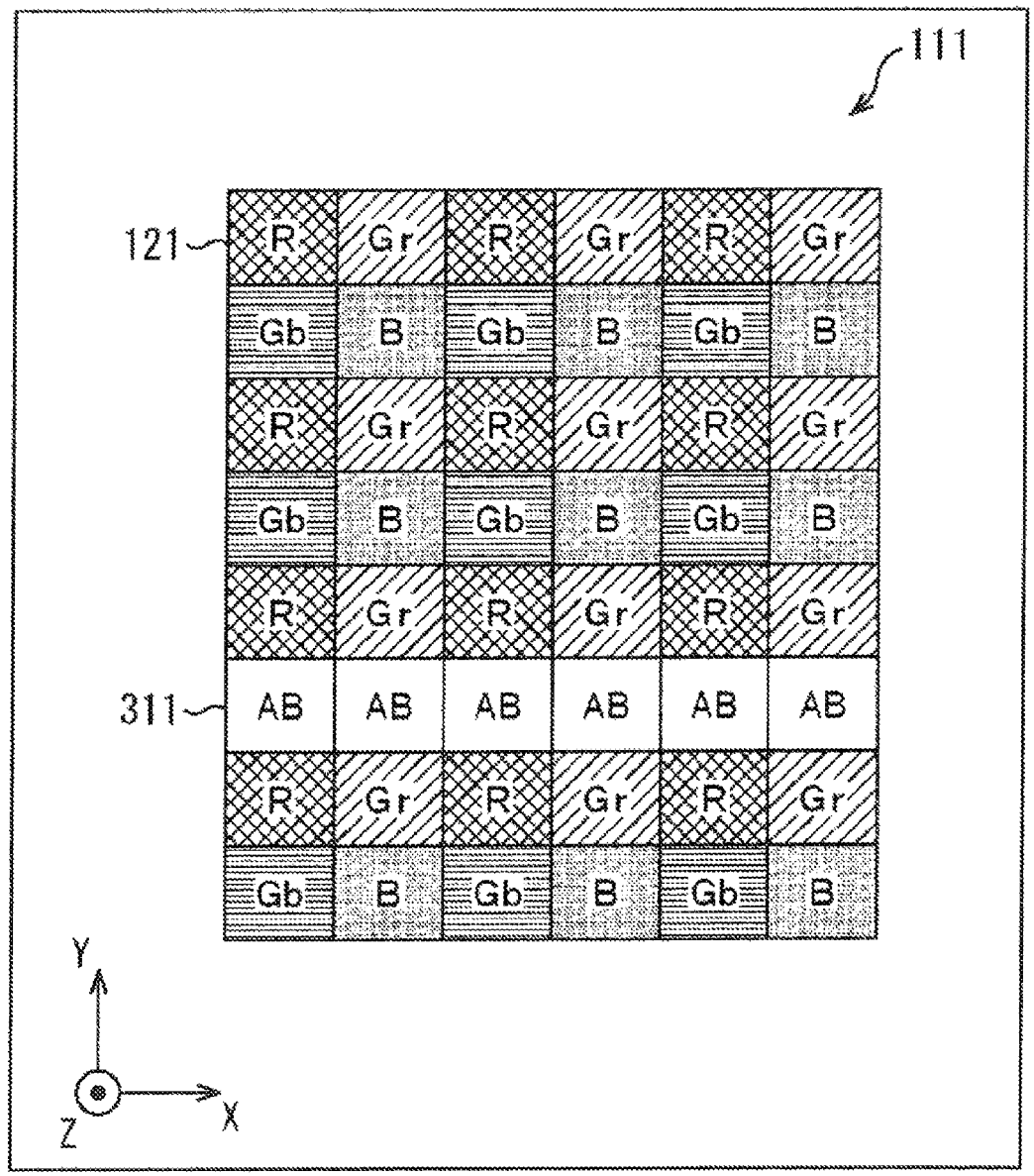
FIG. 19 illustrates another example (Modification example 6) of the pixel arrangement of an image sensor.

As illustrated in FIG. 19, in the pixel array unit 111, a plurality of imaging pixels 121 are two-dimensionally arranged in a matrix on an XY plane. The imaging pixels 121 include R pixels, G pixels, and B pixels, which are regularly arranged in a Bayer array.

In addition, in the pixel array unit 111, a plurality of phase difference detection pixels 311 are arranged among the plurality of imaging pixels 121 two-dimensionally arranged in a matrix. Specifically, the phase difference detection pixels 311 include AB pixels having a function of two pixels of an A pixel whose light-receiving region is shielded from light on the right side in the X direction and a B pixel whose light-receiving region is shielded from light on the left side in the X direction. These pixels replace part of the imaging pixels 121 in a predetermined row among the pixel rows in the pixel array unit 111 to be regularly arranged in a specific pattern.

[Example Configuration of Phase Difference Detection Pixel]

Next, an example configuration of the phase difference detection pixel 311 in the pixel array unit 111 is described with reference to FIG. 20.

Note that description is omitted regarding parts of the phase difference detection pixel 311 illustrated in FIG. 20 and the imaging pixel 121 described with reference to FIG. 5 that are formed in a similar manner.

In the phase difference detection pixel 311, the light-shielding film 210 is provided with an opening 321A for allowing the photodiode 201 to receive light and an opening 321B for allowing the memory unit 202 to receive light.

The opening 321A and the opening 321B preferably have the same shape.

In the phase difference detection pixel 311, an on-chip lens 322 is formed in a position where the distance between its optical axis and a side of the opening 321A on the right side (the memory unit 202 side) becomes equal to the distance between its optical axis and a side of the opening 321B on the left side (the photodiode 201 side).

That is, in the phase difference detection pixel 311, the openings 321A and 321B of the light-shielding film 210 are provided in positions symmetrical to each other in the X direction in which the openings 321A and 321B are arrayed, with respect to the optical axis of the on-chip lens 322.

Note that the position and size of the on-chip lens 322 in the phase difference detection pixel 311 are preferably the same as the position and size of the to on-chip lens 213 in the imaging pixel 121.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

The operation of the phase difference detection pixel 311 illustrated in FIG. 20 corresponds to the operation described with reference to FIG. 9 and the operation described with reference to FIG. 10 performed sequentially. That is, in the phase difference detection pixel 311, in performing phase difference detection, charge accumulated in the photodiode 201 is read separately from charge accumulated in the memory unit 202.

Figure 20:
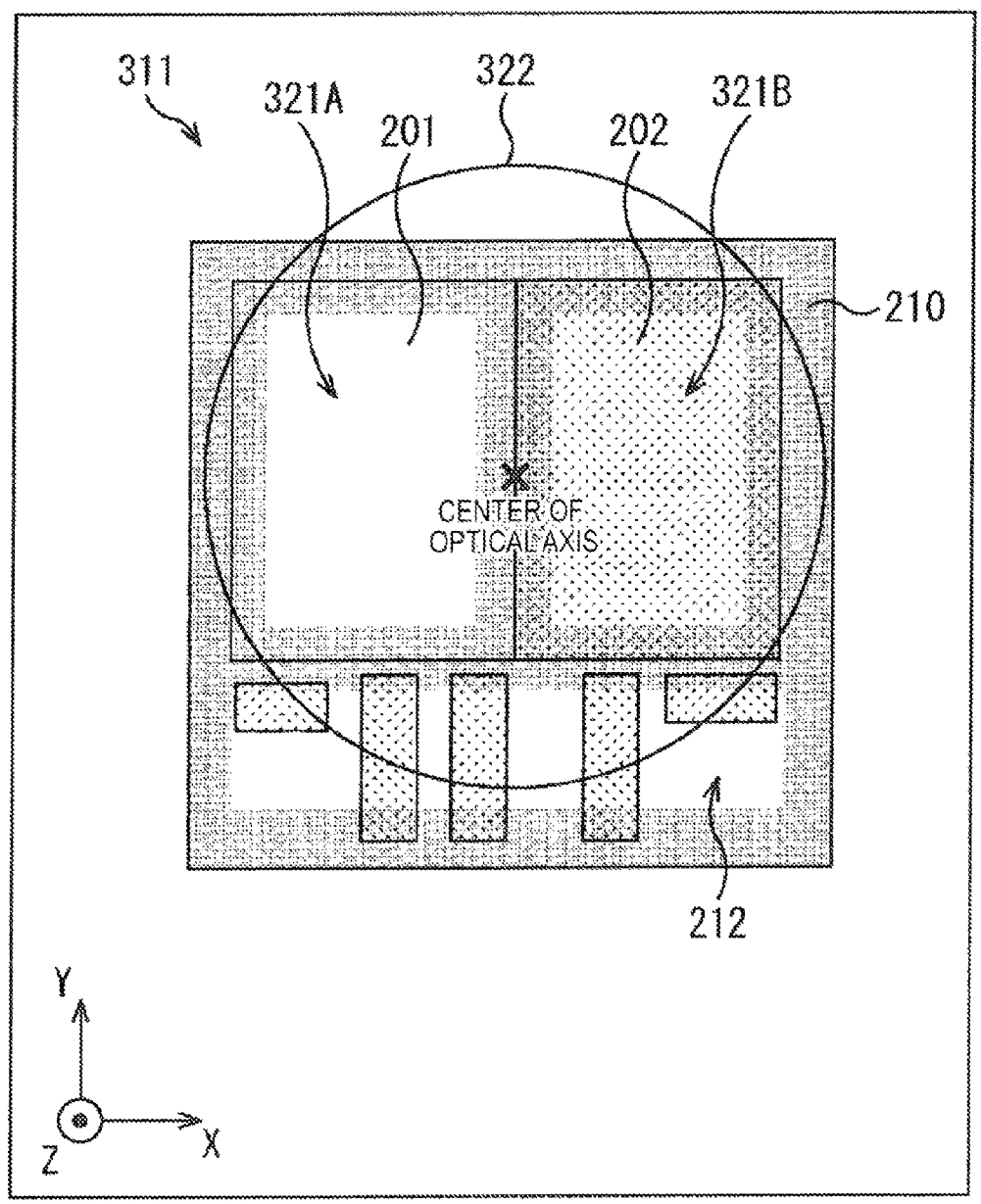
FIG. 20 is a top view of still another example configuration (Modification example 6) of a phase difference detection pixel.
Figure 21:
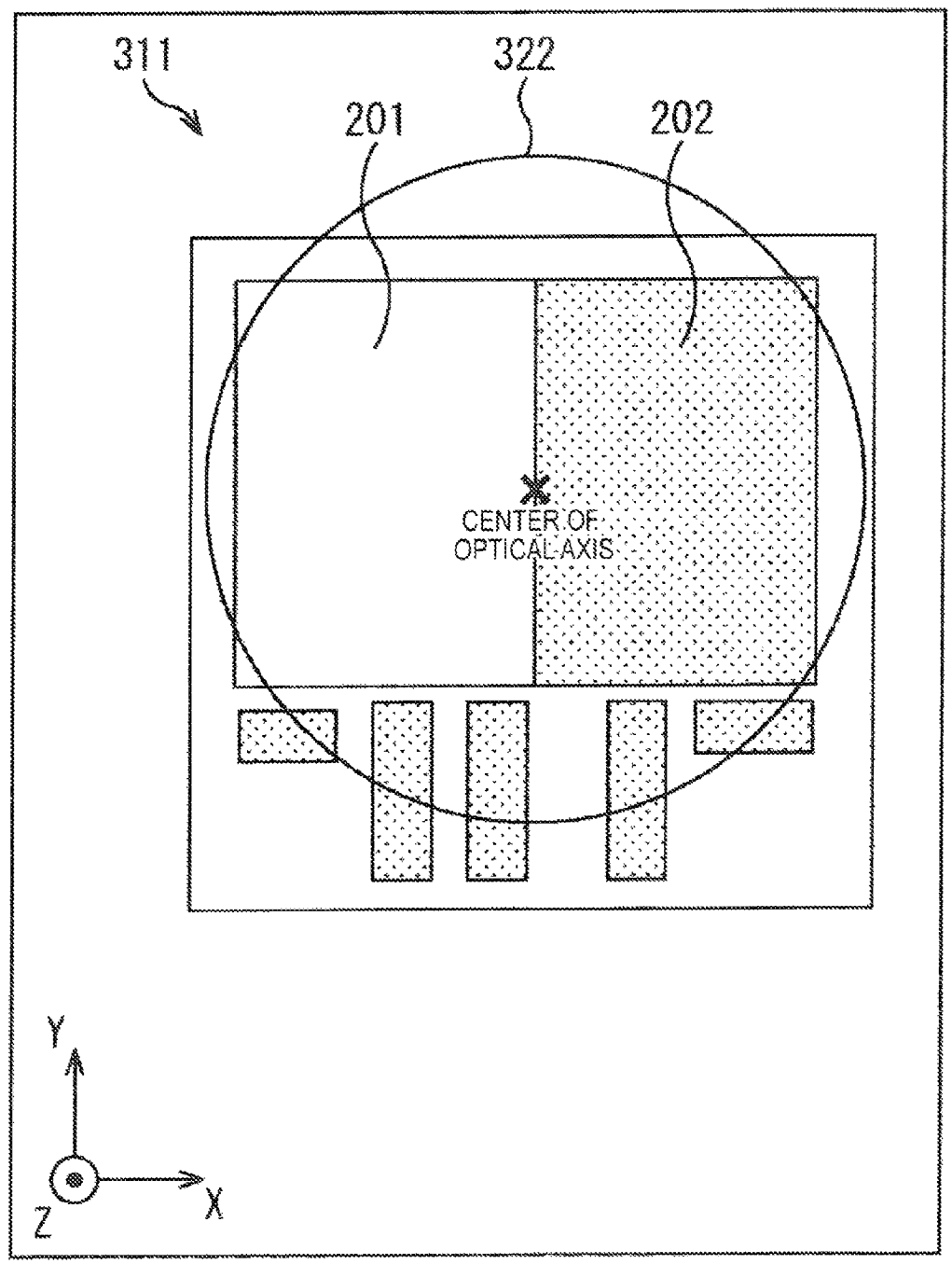
FIG. 21 is a top view of still another example configuration (modification of Modification example 6) of a phase difference detection pixel.

In the phase difference detection pixel 311 of FIG. 20, both the photodiode 201 and the memory unit 202 are provided with an opening and need not be shielded from light; therefore, as illustrated in FIG. 21, the phase difference detection pixel 311 can refrain from including the light-shielding film 210.

In this case, in the phase difference detection pixel 311, the photodiode 201 and the memory unit 202 are provided in positions symmetrical to each other in the X direction in which the photodiode 201 and the memory unit 202 are arrayed, with respect to the optical axis of the on-chip lens 322.

Modification Example 7

By the way, in the configuration in which the memory unit 202 is provided with an opening, among the above-described configurations of the phase difference detection pixels, the first transfer gate 203 is formed above the memory unit 202 to cover the upper portion of the memory unit 202; therefore, the memory unit 202 may not be able to obtain sufficient light-receiving properties.

Figure 22:
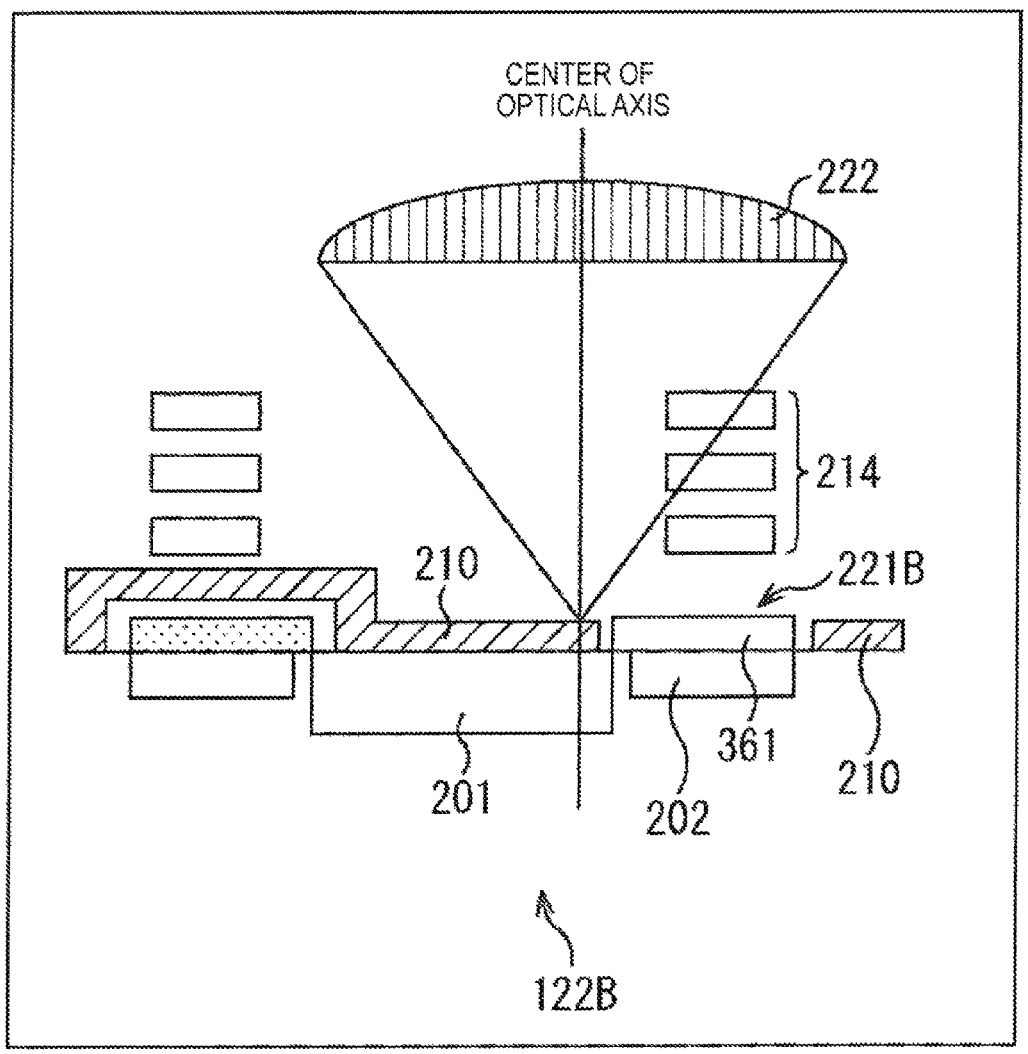
FIG. 22 is a cross-sectional view of still another example configuration (Modification example 7) of a phase difference detection pixel.

Thus, for example, the phase difference detection pixel 122B is provided with a first transfer gate 361 formed using a transparent conductive film, instead of the first transfer gate 203, as illustrated in FIG. 22.

Indium tin oxide (ITO), zinc oxide, tin oxide, or the like is used as the material of the transparent conductive film. The transmittance of the first transfer gate 361 is preferably 80% or more, for example.

Such a configuration allows the memory unit 202 to obtain sufficient light-receiving properties.

Note that this configuration can be applied to the phase difference detection pixel 122B of FIG. 14 and the phase difference detection pixel 311 of FIGS. 20 and 21 as well as the phase difference detection pixel 122B of FIG. 7 (FIG. 8).

In the above-described configurations, the phase difference detection pixels are shielded from light on the left side and the right side; however, depending on the pixel arrangement, the phase difference detection pixels may be shielded from light on the upper side and the lower side, or may be obliquely shielded from light.

Modification Example 8

Example Configuration of Phase Difference Detection Pixel

Figure 23:
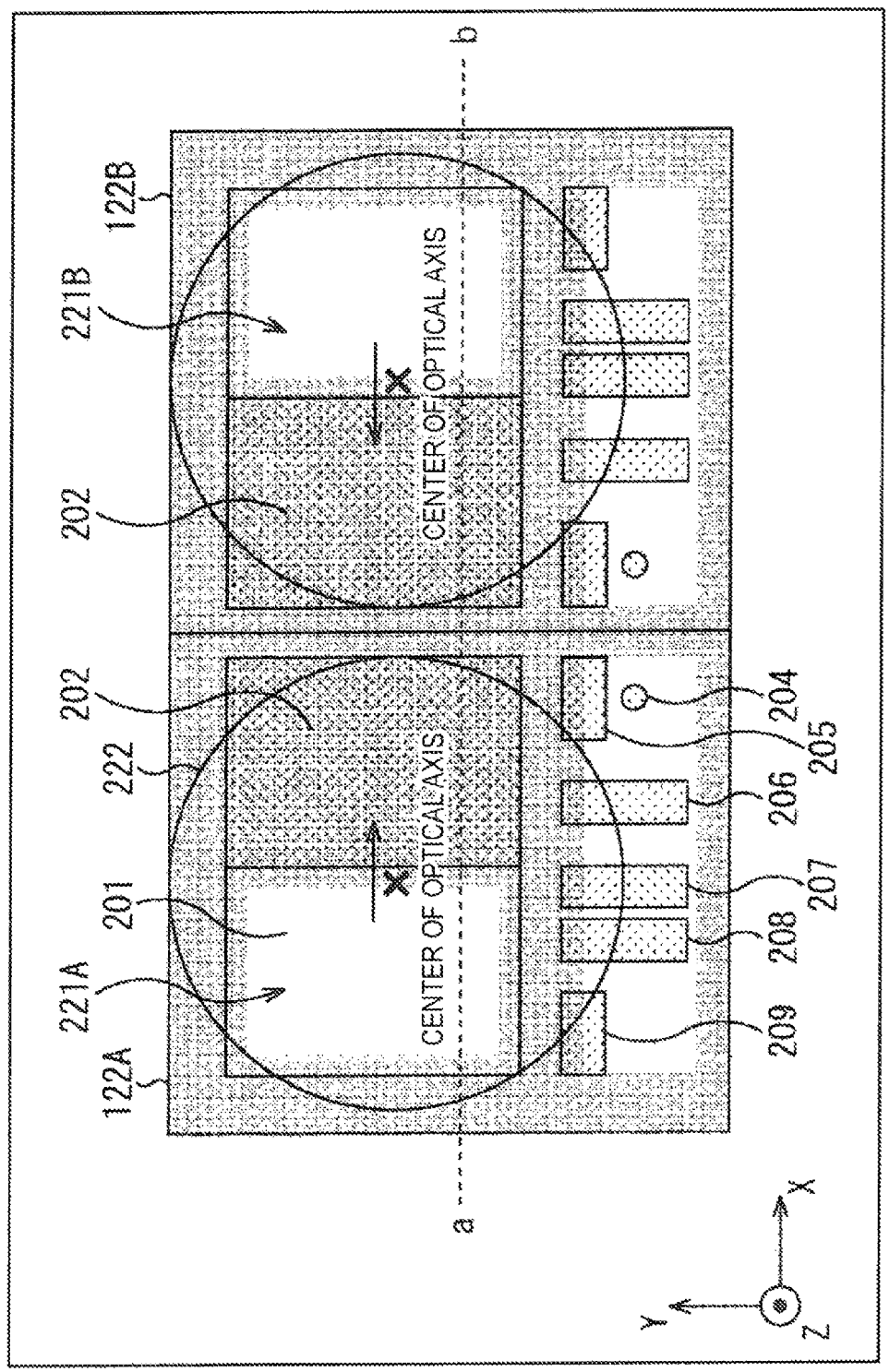
FIG. 23 is a top view of still another example configuration (Modification example 8) of phase difference detection pixels.
Figure 24:
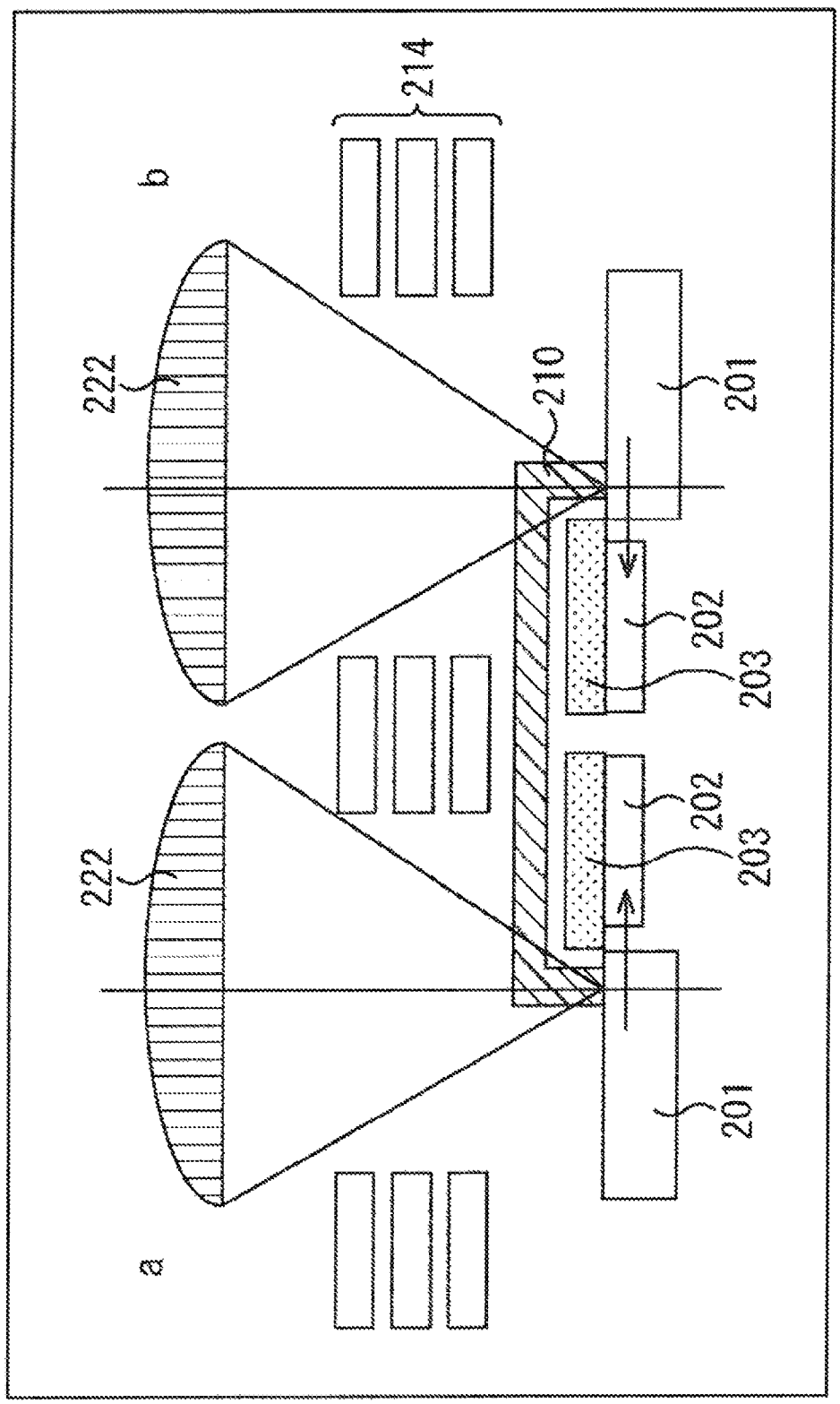
FIG. 24 is a cross-sectional view of the phase difference detection pixels illustrated in FIG. 23.

FIGS. 23 and 24 illustrate still another example configuration of the phase difference detection pixel 122. FIG. 34 is a top view, and FIG. 24 is a cross-sectional view along the broken line a-b of FIG. 23.

Note that description is omitted regarding parts of the phase difference detection pixels 122A and 1223 illustrated in FIG. 23 and the phase difference detection pixels 122A and 122B illustrated in FIG. 7 that are formed in a similar manner.

In the example configuration illustrated in FIG. 23, the phase difference detection pixels 122A and 122B are integrally formed on one chip to be arranged adjacently in the X direction. In the phase difference detection pixels 122A and 122B, the photodiodes 201 and the memory units 202 are formed in positions symmetrical to each other in the X direction. In other words, the phase difference detection pixels 122A and 122B are arranged such that, with respect to the Y axis serving as the boundary therebetween, constituent elements such as the photodiodes 201 and the memory units 202 have mirror symmetry.

Specifically, while the photodiode 201 is formed on the left side and the memory unit 202 is formed on the right side in the phase difference detection pixel 122A, the memory unit 202 is formed on the left side and the photodiode 201 is formed on the right side in the phase difference detection pixel 122B.

The phase difference detection pixel 122A is provided with the opening 221A for allowing the photodiode 201, which is formed on the left side of the phase difference detection pixel 122A, to receive light. The phase difference detection pixel 122B is provided with the opening 221B for allowing the photodiode 201, which is formed on the right side of the phase difference detection pixel 122B, to receive light.

The opening 221A and the opening 221B preferably have the same shape.

The on-chip lens 222 is formed in the same position in each of the phase difference detection pixels 122A and 122B. Specifically, in the phase difference detection pixels 122A and 122B, the on-chip lenses 222 are formed in positions where the distance between an optical axis of the on-chip lens 222 and a side of the opening 221A on the right side (the memory unit 202 side) in the phase difference detection pixel 122A becomes equal to the distance between an optical axis of the on-chip lens 222 and a side of the opening 221B on the left side (the memory unit 202 side) in the phase difference detection pixel 122B.

That is, in the pair of phase difference detection pixels 122A and 122B, the openings 221A and 221B of the light-shielding film 210 are provided in positions symmetrical to each other in the X direction in which the phase difference detection pixels 122A and 122B are arrayed, with respect to the optical axes of the on-chip lenses 222.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of the phase difference detection pixels 122A and 122B illustrated in FIG. 23 is similar to that described with reference to FIG. 10.

Modification Example 9

Example Configuration of Phase Difference Detection Pixel

Figure 25:
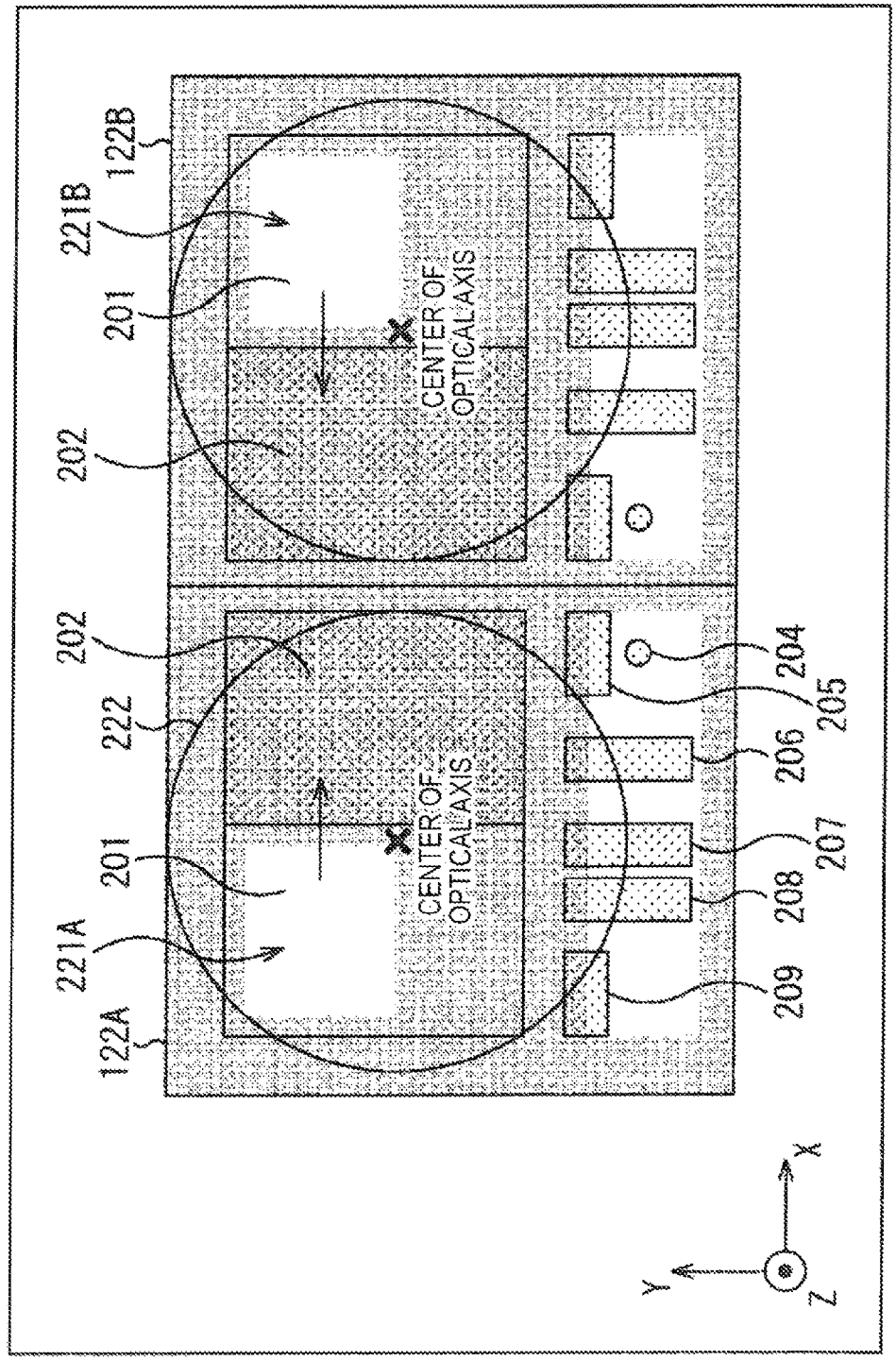
FIG. 25 is a top view of still another example configuration (Modification example 9) of phase difference detection pixels.

FIG. 25 illustrates another example configuration of the phase difference detection pixel 122.

Note that description is omitted regarding parts of the phase difference detection pixels 122A and 122B illustrated in FIG. 25 and the phase difference detection pixels 122A and 122B illustrated in FIG. 7 that are formed in a similar manner.

In the example configuration illustrated in FIG. 25, the phase difference detection pixels 122A and 122B are integrally formed on one chip to be arranged adjacently in the X direction. In the phase difference detection pixels 122A and 122B, the photodiodes 201 and the memory units 202 are formed in positions symmetrical to each other in the X direction. In other words, the phase difference detection pixels 122A and 122B are arranged such that, with respect to the Y axis serving as the boundary therebetween, constituent elements such as the photodiodes 201 and the memory units 202 have mirror symmetry.

Specifically, while the photodiode 201 is formed on the left side and the memory unit 202 is formed on the right side in the phase difference detection pixel 122A, the memory unit 202 is formed on the left side and the photodiode 201 is formed on the right side in the phase difference detection pixel 122B.

In the phase difference detection pixel 122A, approximately half of the photodiode 201, which is formed on the left side of the phase difference detection pixel 122A, on the upper side is provided with the opening 221A. In the phase difference detection pixel 122B, approximately half of the photodiode 201, which is formed on the right side of the phase difference detection pixel 122B, on the upper side is provided with the opening 221B.

The opening 221A and the opening 221B preferably have the same shape.

The on-chip lens 222 is formed in the same position in each of the phase difference detection pixels 122A and 122B. Specifically, in the phase difference detection pixels 122A and 122B, the on-chip lenses 222 are formed in positions where the distance between an optical axis of the on-chip lens 222 and a side of the opening 221A on the right side (the memory unit 202 side) in the phase difference detection pixel 122A becomes equal to the distance between an optical axis of the on-chip lens 222 and a side of the opening 221B on the left side (the photodiode 201 side) in the phase difference detection pixel 122B.

That is, in the pair of phase difference detection pixels 122A and 122B, the openings 221A and 221B of the light-shielding film 210 are provided in positions symmetrical to each other in the X direction in which the phase difference detection pixels 122A and 122B are arrayed, with respect to the optical axes of the on-chip lenses 222. In other words, the openings 221A and 221B also have mirror symmetry with respect to the Y axis serving as the boundary between the phase difference detection pixels 122A and 122B.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of each of the phase difference detection pixels 122A and 122B illustrated in FIG. 25 is similar to that described with reference to FIG. 10.

Modification Example 10

Example Configuration of Phase Difference Detection Pixel

Figure 26:
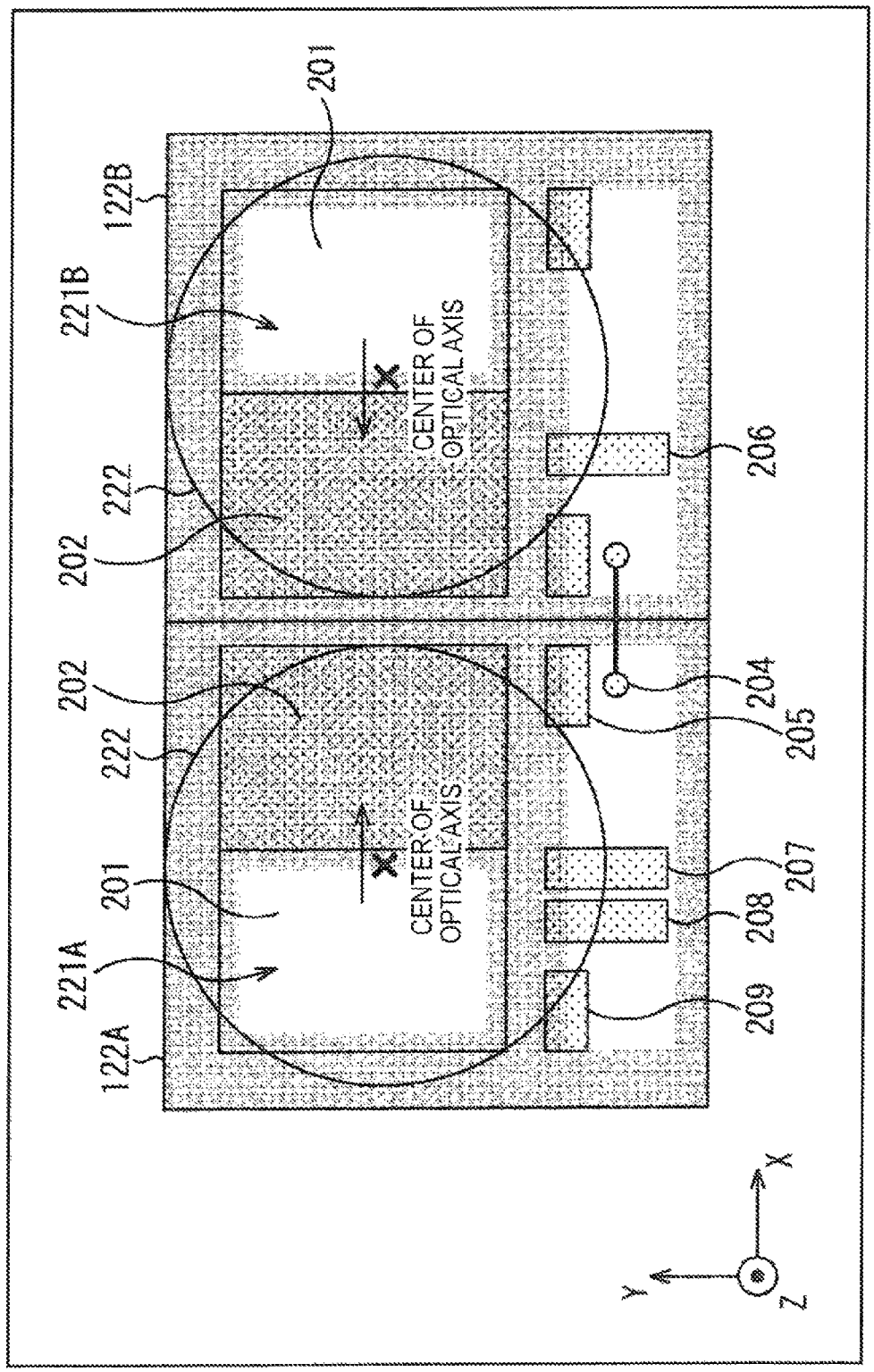
FIG. 26 is a top view of still another example configuration (Modification example 10) of phase difference detection pixels.

FIG. 26 illustrates still another example configuration of the phase difference detection pixel 122.

Description is omitted regarding parts of the phase difference detection pixels 122A and 122B illustrated in FIG. 26 and the phase difference detection pixels 122A and 122B illustrated in FIG. 7 that are formed in a similar manner.

In the example configuration illustrated in FIG. 26, like the phase difference detection pixels 122A and 122B illustrated in FIG. 23 (Modification example 8), the phase difference detection pixels 122A and 122B are integrally formed on one chip to be arranged adjacently, and are arranged such that, with respect to the Y axis serving as the boundary therebetween, constituent elements have mirror symmetry.

Note that the floating diffusion region 204, the reset transistor 206, the amplifier transistor 207, and the selection transistor 208 are shared by two pixels, the phase difference detection pixels 122A and 122B.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of the phase difference detection pixels 122A and 122B illustrated in FIG. 26 is similar to that described with reference to FIG. 10.

Modification Example 1

Example Configuration of Phase Difference Detection Pixel

Figure 27:
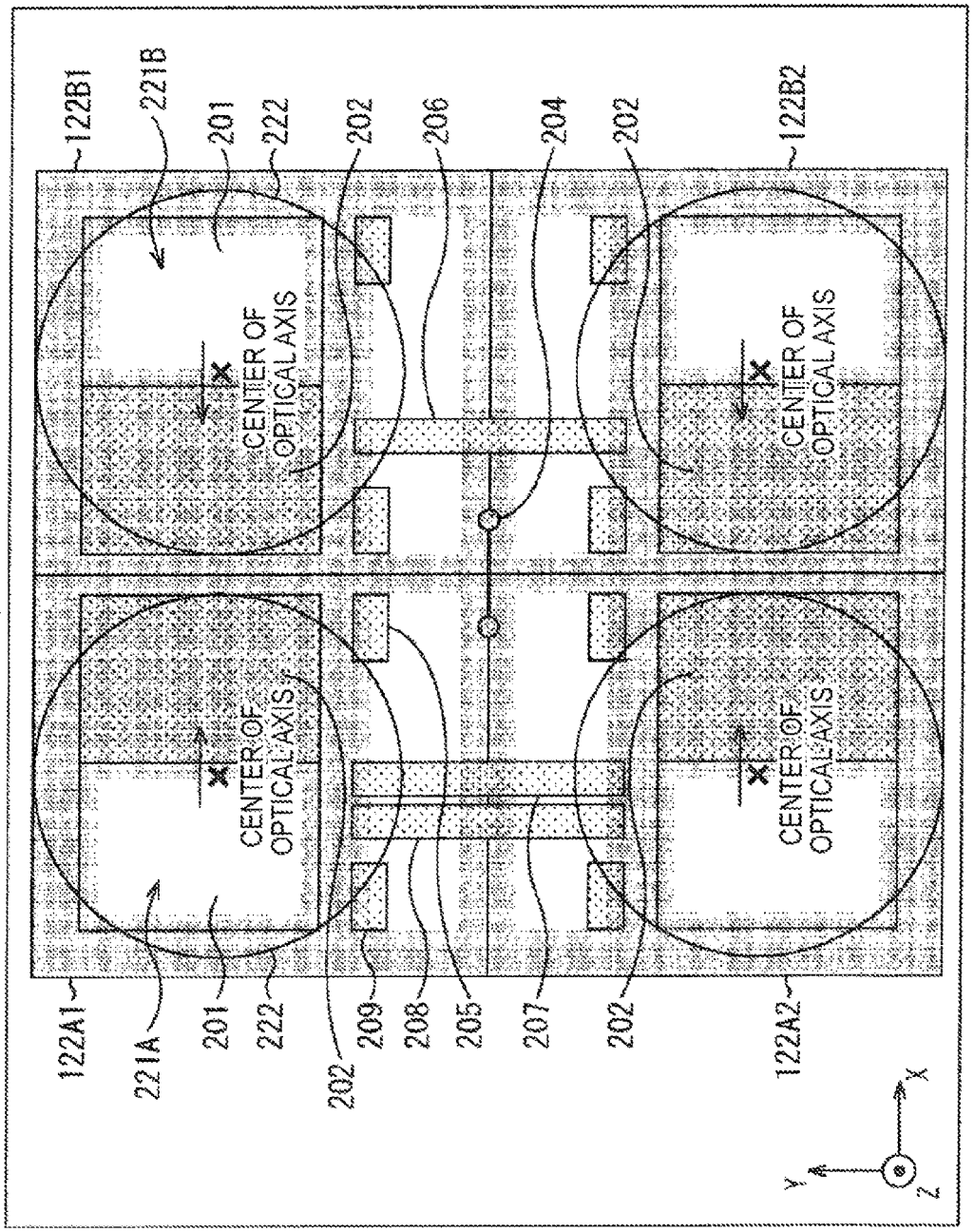
FIG. 27 is a top view of still another example configuration (Modification example 11) of phase difference detection pixels.

FIG. 27 illustrates still another example configuration of the phase difference detection pixel 122.

In the example configuration of FIG. 27, a configuration for mirror symmetry with respect to the X axis is added to the lower side of the example configuration illustrated in FIG. 26 (Modification example 10); thus, four pixels, the phase difference detection pixels 122A1, 122A2, 122B1, and 122B2, are integrally formed on one chip to be arranged adjacently in two pixels×two pixels. For the example configuration of FIG. 27, the imaging pixels 121 of at least two consecutive rows or columns in the pixel array unit 111 need to be replaced with the phase difference detection pixels 122.

In the example configuration of FIG. 27, the floating diffusion region 204, the reset transistor 206, the amplifier transistor 207, and the selection transistor 208 are shared by four pixels, the phase difference detection pixels 122A1, 122A2, 122B1, and 122B2.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of the phase difference detection pixels 122A1, 122A2, 122B1, and 122B2 illustrated in FIG. 27 is similar to that described with reference to FIG. 10.

Modification Example 12

Example Configuration of Phase Difference Detection Pixel

Figure 28:
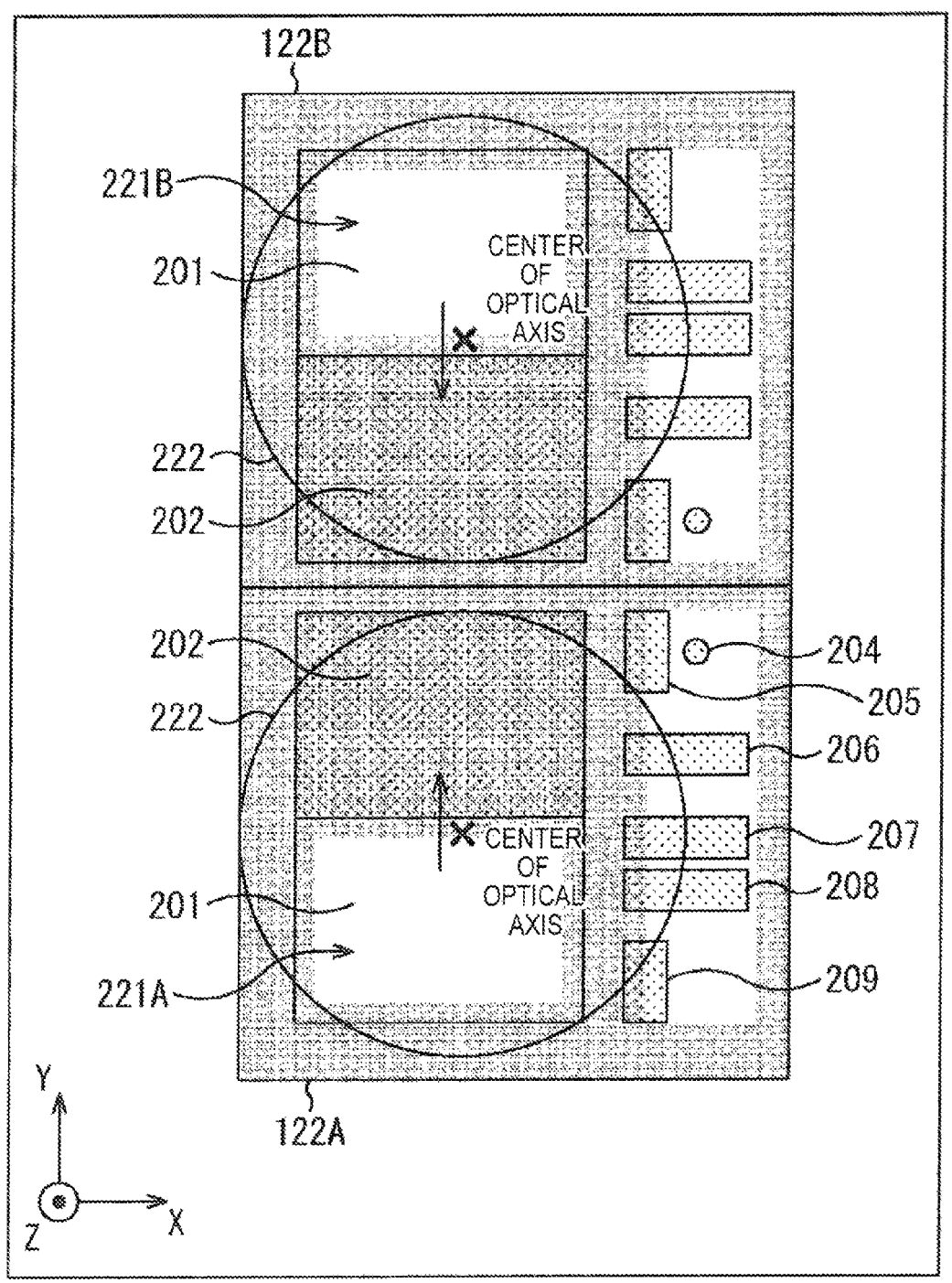
FIG. 28 is a top view of still another example configuration (Modification example 12) of phase difference detection pixels.

FIG. 28 illustrates still another example configuration of the phase difference detection pixel 122.

The example configuration of FIG. 28 is obtained by rotating the example configuration illustrated in FIG. 23 (Modification example 8) by 90 degrees using the Z axis as a rotation axis. That is, the phase difference detection pixels 122A and 122B illustrated in FIG. 28 are integrally formed on one chip to be arranged adjacently in the Y direction. In the phase difference detection pixels 122A and 122B, the photodiodes 201 and the memory units 202 are formed in positions symmetrical to each other in the Y direction. In other words, the phase difference detection pixels 122A and 122B are arranged such that, with respect to the X axis serving as the boundary therebetween, constituent elements such as the photodiodes 201 and the memory units 202 have mirror symmetry.

For the example configuration of FIG. 28, the phase difference detection pixels 122 are arranged side by side in the Y direction (column direction) in the pixel array unit ill.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of the phase difference detection pixels 122A and 122B illustrated in FIG. 28 is similar to that described with reference to FIG. 10.

Modification Example 13

Example Configuration of Phase Difference Detection Pixel

Figure 29:
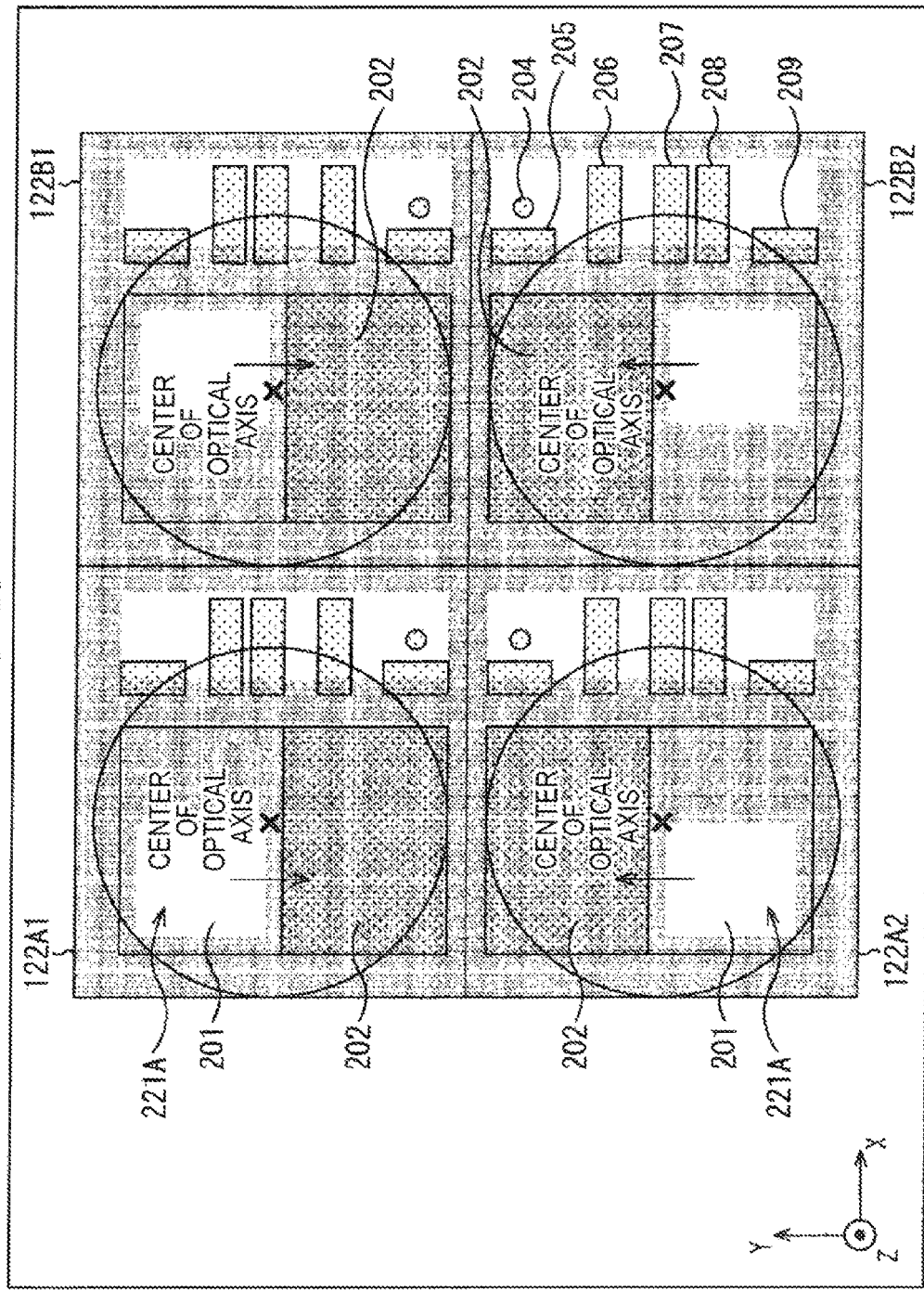
FIG. 29 is a top view of still another example configuration (Modification example 13) of phase difference detection pixels.

FIG. 29 illustrates still another example configuration of the phase difference detection pixel 122.

In the example configuration of FIG. 29, two configurations obtained by rotating the example configuration illustrated in FIG. 25 (Modification example 9) by 90 degrees using the Z axis as a rotation axis are arranged side by side in the X-axis direction; thus, four pixels, the phase difference detection pixels 122A1, 122A2, 122B1, and 122B2, are integrally formed on one chip to be arranged adjacently in two pixels×two pixels.

For the example configuration of FIG. 29, the imaging pixels 121 of at least two consecutive rows or columns in the pixel array unit 111 need to be replaced with the phase difference detection pixels 122.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of the phase difference detection pixels 122A1, 122A2, 122B1, and 122B2 illustrated in FIG. 29 is similar to that described with reference to FIG. 10.

Modification Example 14

Example Configuration of Phase Difference Detection Pixel

Figure 30:
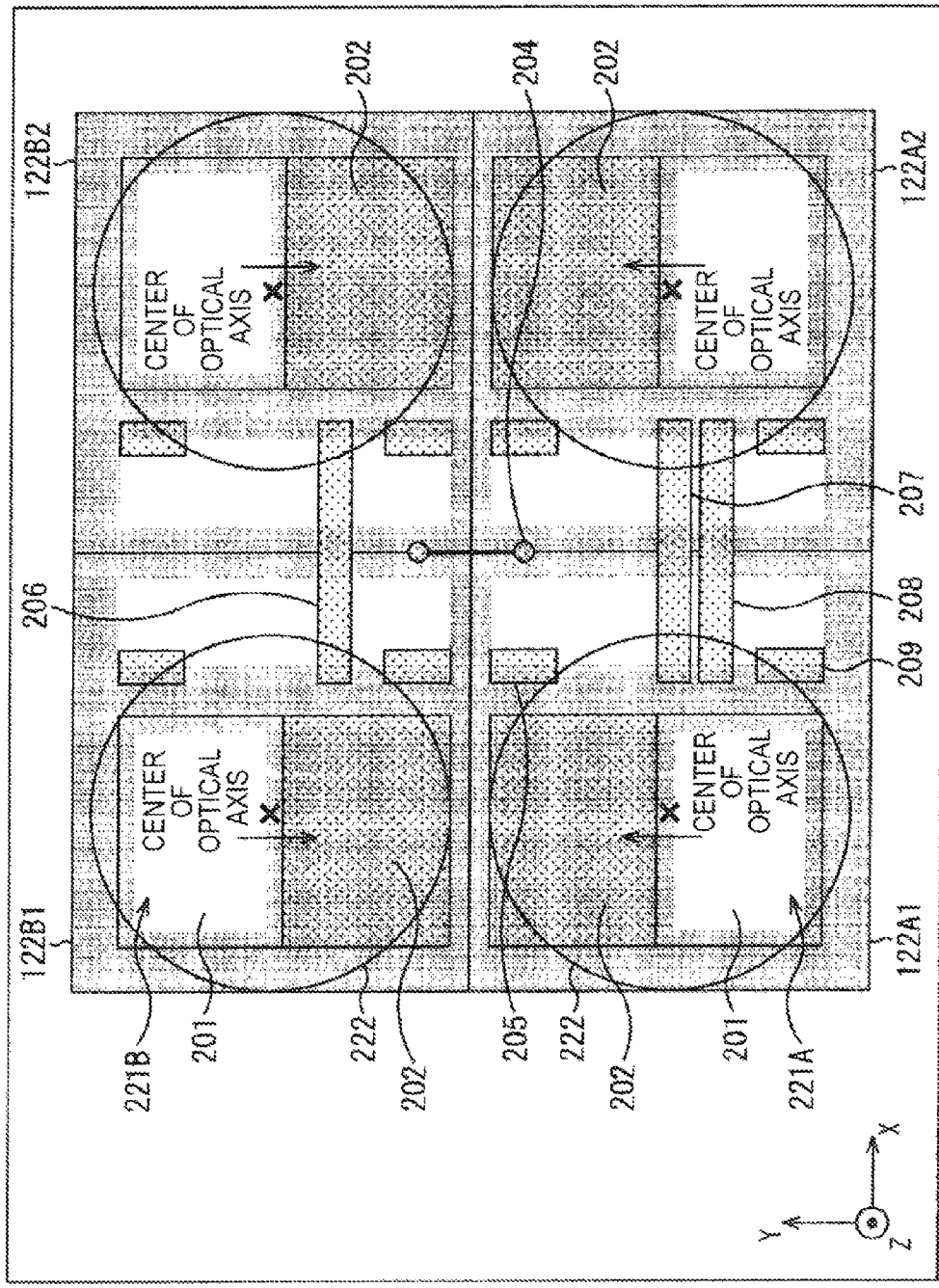
FIG. 30 is a top view of still another example configuration (Modification example 14) of phase difference detection pixels.

FIG. 30 illustrates still another example configuration of the phase difference detection pixel 122.

In the example configuration of FIG. 30, a configuration for mirror symmetry with respect to the X axis is added to the right side of the example configuration illustrated in FIG. 28 (Modification example 12); thus, four pixels, the phase difference detection pixels 122A1, 122A2, 122B1, and 122B2, are integrally formed on one chip to be arranged adjacently in two pixels×two pixels. For the example configuration of FIG. 30, the imaging pixels 121 of at least two consecutive rows or columns in the pixel array unit 111 need to be replaced with the phase difference detection pixels 122.

In the example configuration of FIG. 30, the floating diffusion region 204, the reset transistor 206, the amplifier transistor 207, and the selection transistor 208 are shared by four pixels, the phase difference detection pixels 122A1, 122A2, 122B81, and 122B2.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of the phase difference detection pixels 122A1, 122A2, 122B1, and 122B2 illustrated in FIG. 30 is similar to that described with reference to FIG. 10.

Modification Example 15

Example Configuration of Phase Difference Detection Pixel

Figure 31:
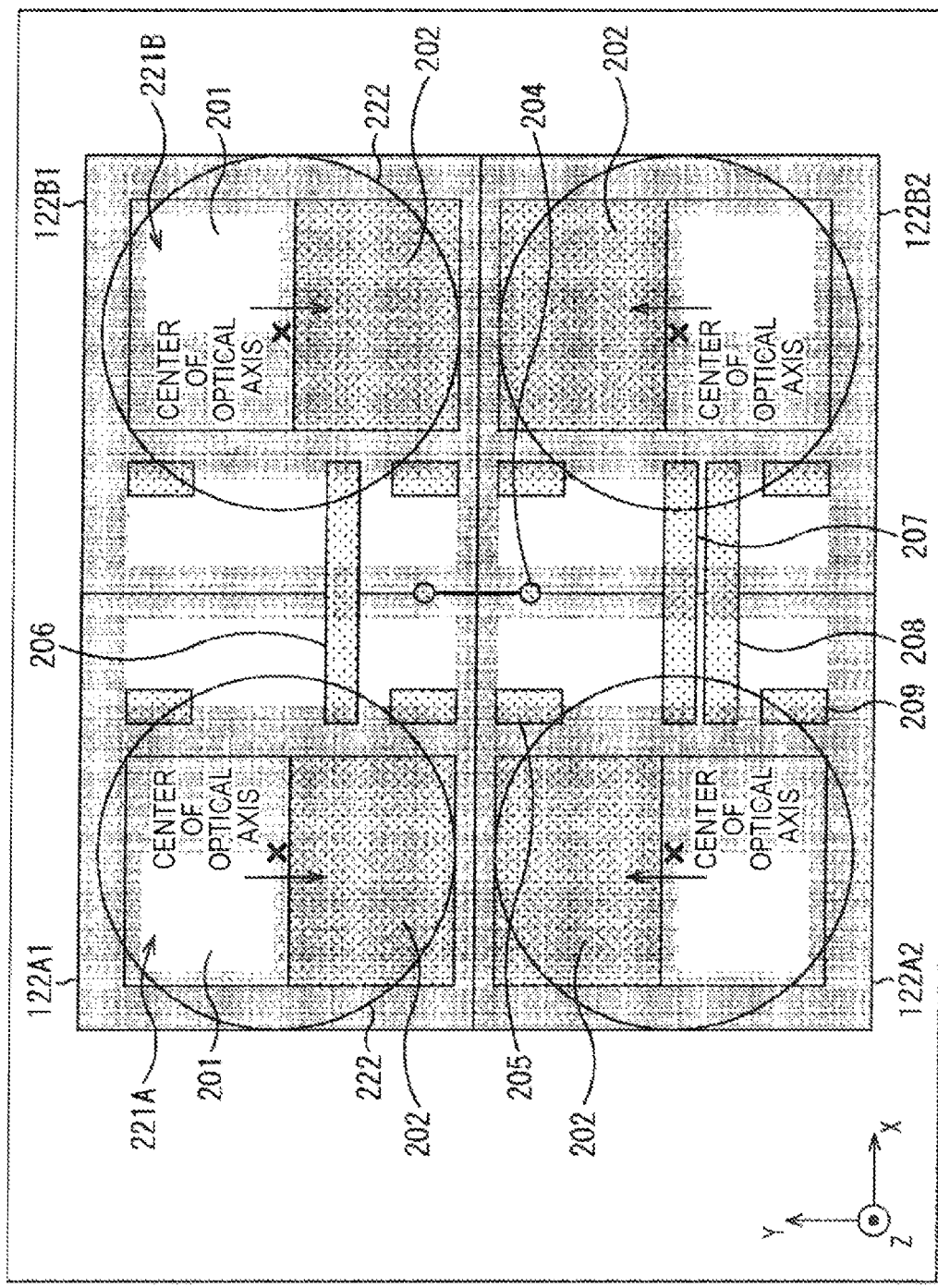
FIG. 31 is a top view of still another example configuration (Modification example 15) of phase difference detection pixels.

FIG. 31 illustrates still another example configuration of the phase difference detection pixel 122.

In the example configuration of FIG. 31, a configuration for mirror symmetry with respect to the X axis is added to the right side of a configuration obtained by rotating the example configuration illustrated in FIG. 25 (Modification example 9) by 90 degrees using the Z axis as a rotation axis; thus, four pixels, the phase difference detection pixels 122A1, 122A2, 122B1, and 122B2, are integrally formed on one chip to be arranged adjacently in two pixels×two pixels. For the example configuration of FIG. 31, the imaging pixels 121 of at least two consecutive rows or columns in the pixel array unit 111 need to be replaced with the phase difference detection pixels 122.

In the example configuration of FIG. 31, the floating diffusion region 204, the reset transistor 206, the amplifier transistor 207, and the selection transistor 208 are shared by four pixels, the phase difference detection pixels 122A1, 122A2, 122B1, and 122B2.

Also with the above structure, it is possible to improve the precision of phase difference detection while suppressing deterioration of resolution in a solid-state imaging device 1 having the global shutter function and the phase difference AF function, because the area of the light-receiving region of the phase difference detection pixel is not reduced and the number of effective pixels of the whole solid-state imaging device need not be reduced.

Note that the operation of the phase difference detection pixels 122A1, 122A2, 122B1, and 122B2 illustrated in FIG. 31 is similar to that described with reference to FIG. 10.

Note that this embodiment shows examples in which the floating diffusion region 204, the reset transistor 206, the amplifier transistor 207, and the selection transistor 208 are shared by a plurality of pixels for only the phase difference detection pixels 122; however, these can also be shared by a plurality of imaging pixels 121.

The present technology is not limited to the above embodiment, and may assume various modifications within the scope of the present technology.

Additionally, the present technology may also be configured as below.

(1)

A solid-state imaging device including:

a pixel array unit including, as pixels including an on-chip lens, a photoelectric conversion unit, and a charge accumulation unit, imaging pixels for generating a captured image and phase difference detection pixels for performing phase difference detection arrayed therein; and a driving control unit configured to control driving of the pixels, wherein the imaging pixel is formed with the charge accumulation unit shielded from light, and wherein the phase difference detection pixel is formed in a manner that at least part of at least one of the photoelectric conversion unit and the charge accumulation unit refrains from being shielded from light.

(2)

The solid-state imaging device according to (1), wherein the driving control unit reads, in performing the phase difference detection, charge accumulated in at least part of at least one of the photoelectric conversion unit and the charge accumulation unit in the phase difference detection pixels, and performs, in generating the captured image, accumulation of charge in at least the imaging pixels simultaneously.

(3)

The solid-state imaging device according to (1) or (2), wherein the phase difference detection pixel includes a light-shielding film that is provided with an opening in at least part of at least one of the photoelectric conversion unit and the charge accumulation unit, and wherein, in a pair of the phase difference detection pixels, the openings are provided in positions symmetrical to each other in a first direction in which the pair of phase difference detection pixels are arrayed, with respect to optical axes of the on-chip lenses.

(4)

The solid-state imaging device according to any of (1) to (3), wherein the charge accumulation unit is formed as a charge retention unit configured to retain charge from the photoelectric conversion unit.

(5)

The solid-state imaging device according to (4), wherein the photoelectric conversion unit and the charge retention unit are formed side by side in the first direction, and wherein the photoelectric conversion unit is provided with the opening in one of the pair of phase difference detection pixels, and the charge retention unit is provided with the opening in the other of the pair of phase difference detection pixels.

(6)

The solid-state imaging device according to (5), wherein, in performing the phase difference detection, the driving control unit reads charge accumulated in the photoelectric conversion unit in the one phase difference detection pixel, and reads charge accumulated in the charge retention unit in the other phase difference detection pixel.

(7)

The solid-state imaging device according to (6), wherein the driving control unit controls driving of the one phase difference detection pixel and the other phase difference detection pixel in a manner that a product of sensitivity of the photoelectric conversion unit and accumulation time in the one phase difference detection pixel becomes equal to a product of sensitivity of the charge retention unit and accumulation time in the other phase difference detection pixel.

(8)

The solid-state imaging device according to (4), wherein the photoelectric conversion unit and the charge retention unit are formed side by side in the first direction, and wherein approximately half of the photoelectric conversion unit in the first direction is provided with the opening in one of the pair of phase difference detection pixels, and the other approximately half of the photoelectric conversion unit in the first direction is provided with the opening in the other of the pair of phase difference detection pixels.

(9)

The solid-state imaging device according to (4), wherein, in the pair of phase difference detection pixels, the photoelectric conversion units and the charge retention units are formed in positions with mirror symmetry with respect to a boundary between the pair of phase difference detection pixels, and wherein, in each of the pair of phase difference detection pixels, the photoelectric conversion unit is provided with the opening.

(10)

The solid-state imaging device according to (4), wherein the photoelectric conversion unit and the charge retention unit are formed side by side in a second direction perpendicular to the first direction, and wherein approximately half of the photoelectric conversion unit and the charge retention unit in the first direction is provided with the opening in one of the pair of phase difference detection pixels, and the other approximately half of the photoelectric conversion unit and the charge retention unit in the first direction is provided with the opening in the other of the pair of phase difference detection pixels.

(11)

The solid-state imaging device according to (10), wherein, in performing the phase difference detection, the driving control unit reads charge accumulated in the photoelectric conversion unit and the charge retention unit in the one phase difference detection pixel together, and reads charge accumulated in the photoelectric conversion unit and the charge retention unit in the other phase difference detection pixel together.

(12)

The solid-state imaging device according to (3), wherein, in the phase difference detection pixel, the charge accumulation unit is formed as another photoelectric conversion unit side by side with the photoelectric conversion unit in the first direction, and wherein the photoelectric conversion unit is provided with the opening in one of the pair of phase difference detection pixels, and the other photoelectric conversion unit is provided with the opening in the other of the pair of phase difference detection pixels.

(13)

The solid-state imaging device according to (1) or (2), wherein, in the phase difference detection pixel, the photoelectric conversion unit and the charge accumulation unit are formed in positions symmetrical to each other in a predetermined direction, with respect to an optical axis of the on-chip lens, and wherein, in performing the phase difference detection, the driving control unit reads charge accumulated in the photoelectric conversion unit in the phase difference detection pixel and charge accumulated in the charge retention unit in the phase difference detection pixel separately.

(14)

The solid-state imaging device according to (13), wherein the charge accumulation unit is formed as a charge retention unit configured to retain charge from the photoelectric conversion unit.

(15)

The solid-state imaging device according to (13) or (14), wherein the phase difference detection pixel includes a light-shielding film that is provided with openings in part of the photoelectric conversion unit and the charge accumulation unit, and wherein the openings are provided in positions symmetrical to each other in the predetermined direction, with respect to an optical axis of the on-chip lens.

(16)

The solid-state imaging device according to (1) or (2), wherein the charge accumulation unit is formed as a charge retention unit configured to retain charge from the photoelectric conversion unit, wherein the phase difference detection pixel includes a transfer electrode configured to transfer charge from the photoelectric conversion unit to the charge retention unit above the charge retention unit, and wherein the transfer electrode is formed using a transparent conductive film.

(17)

The solid-state imaging device according to any of (1) to (16), wherein at least one of the imaging pixel and the phase difference detection pixel shares constituent elements among a plurality of pixels.

(18)

The solid-state imaging device according to (17), wherein the constituent elements shared by the plurality of pixels include at least one of a floating diffusion region, a reset transistor, an amplifier transistor, and a selection transistor.

(19)

A driving method of a solid-state imaging device, the solid-state imaging device including a pixel array unit including, as pixels including an on-chip lens, a photoelectric conversion unit, and a charge accumulation unit, imaging pixels for generating a captured image and phase difference detection pixels for performing phase difference detection arrayed therein, and a driving control unit configured to control driving of the pixels, wherein the imaging pixel is formed with the charge accumulation unit shielded from light, and wherein the phase difference detection pixel is formed in a manner that at least part of at least one of the photoelectric conversion unit and the charge accumulation unit refrains from being shielded from light, the driving method including the steps of:

reading, in the phase difference detection performed by the solid-state imaging device, charge accumulated in at least part of at least one of the photoelectric conversion unit and the charge accumulation unit in the phase difference detection pixels; and performing, in generation of the captured image by the solid-state imaging device, accumulation of charge in at least the imaging pixels simultaneously.

(20)

An electronic apparatus including a solid-state imaging device including a pixel array unit including, as pixels including an on-chip lens, a photoelectric conversion unit, and a charge accumulation unit, imaging pixels for generating a captured image and phase difference detection pixels for performing phase difference detection arrayed therein, and a driving control unit configured to control driving of the pixels, wherein the imaging pixel is formed with the charge accumulation unit shielded from light, and wherein the phase difference detection pixel is formed in a manner that at least part of at least one of the photoelectric conversion unit and the charge accumulation unit refrains from being shielded from light.

REFERENCE SIGNS LIST 1 electronic apparatus
14 image sensor
111 pixel array unit
121 imaging pixel
122 phase difference detection pixel
201 photodiode
202 memory unit
203 first transfer gate
210 light-shielding film
211 opening
213 on-chip lens
221A, 221B opening
222 on-chip lens
231 photodiode
311 phase difference detection pixel
321A, 321B opening
322 on-chip lens
361 first transfer gate

The invention claimed is:

1. A solid-state imaging device, comprising:
a pixel array unit comprising a plurality of imaging pixels for generation of a captured image and a plurality of phase difference detection pixels for phase difference detection,
wherein a first imaging pixel of the plurality of imaging pixels and a first phase difference detection pixel of the plurality of phase difference detection pixels comprise an on-chip lens, a first photoelectric conversion unit, and a charge accumulation unit; and
a driving control unit configured to drive the plurality of imaging pixels and the plurality of phase difference detection pixels,
wherein the charge accumulation unit of the first imaging pixel is shielded from light, and
wherein at least one of a part of the first photoelectric conversion unit or a part of the charge accumulation unit of the first phase difference detection pixel is unshielded from the light,
wherein a pair of phase difference detection pixels of the plurality of phase difference detection pixels includes a plurality of openings in symmetrical positions in a first direction, wherein the first direction is a direction in which the pair of phase difference detection pixels are arrayed with respect to optical axes of the on-chip lens of each of the pair of phase difference detection pixels,
wherein the first photoelectric conversion unit includes a first opening of the plurality of openings in one of the pair of phase difference detection pixels, and
wherein the charge accumulation unit includes a second opening of the plurality of openings in other of the pair of phase difference detection pixels,
wherein the driving control unit is further configured to drive each of the pair of phase difference detection pixels,
wherein a first product of a first sensitivity of the first photoelectric conversion unit and a first accumulation time in the one of the pair of phase difference detection pixels is equal to a second product of a second sensitivity of the charge accumulation unit and a second accumulation time in the other of the pair of phase difference detection pixels.

2. The solid-state imaging device according to claim 1, wherein the driving control unit is further configured to:
read, in the phase difference detection, charge accumulated in at least one of the part of the first photoelectric conversion unit or the part of the charge accumulation unit; and
concurrently accumulate charge in the plurality of imaging pixels, for the generation of the captured image.

3. The solid-state imaging device according to claim 2, wherein the first phase difference detection pixel includes a light-shielding film, wherein the light-shielding film comprises one of the first opening or the second opening.

4. The solid-state imaging device according to claim 3, wherein the charge accumulation unit is configured to retain charge from the first photoelectric conversion unit.

5. The solid-state imaging device according to claim 4, wherein the first photoelectric conversion unit is adjacent to the charge accumulation unit in the first direction.

6. The solid-state imaging device according to claim 5, wherein, in the phase difference detection, the driving control unit is further configured to read charge accumulated in the first photoelectric conversion unit in the one of the pair of phase difference detection pixels, and read charge accumulated in the charge accumulation unit in the other of the pair of phase difference detection pixels.

7. The solid-state imaging device according to claim 4, wherein the first photoelectric conversion unit is adjacent to the charge accumulation unit in the first direction, and
wherein a first half of the first photoelectric conversion unit in the first direction includes the first opening in one of the pair of phase difference detection pixels, and a second half of the first photoelectric conversion unit in the first direction includes the first opening in the other of the pair of phase difference detection pixels.

8. The solid-state imaging device according to claim 4, wherein the pair of phase difference detection pixels includes a plurality of first photoelectric conversion units and a plurality of charge accumulation units in positions with mirror symmetry with respect to a boundary of the pair of phase difference detection pixels, and
wherein, in each of the pair of phase difference detection pixels, the first photoelectric conversion unit includes the first opening.

9. The solid-state imaging device according to claim 4, wherein the first photoelectric conversion unit is adjacent to the charge accumulation unit in a second direction perpendicular to the first direction, and
wherein a first half of the first photoelectric conversion unit and the charge accumulation unit in the first direction includes a third opening of the plurality of openings in one of the pair of phase difference detection pixels, and a second half of the first photoelectric conversion unit and the charge accumulation unit in the first direction includes a fourth opening in the other of the pair of phase difference detection pixels.

10. The solid-state imaging device according to claim 9, wherein, in the phase difference detection, the driving control unit is further configured to concurrently read charge accumulated in the first photoelectric conversion unit and the charge accumulation unit in the one of the pair of phase difference detection pixels, and concurrently read charge accumulated in the first photoelectric conversion unit and the charge accumulation unit in the other of the pair of phase difference detection pixels.

11. The solid-state imaging device according to claim 3, wherein, in the first phase difference detection pixel, the charge accumulation unit is a second photoelectric conversion unit that is adjacent to the first photoelectric conversion unit in the first direction, and
wherein the first photoelectric conversion unit includes the first opening of the plurality of openings in one of the pair of phase difference detection pixels, and the second photoelectric conversion unit includes the second opening of the plurality of openings in the other of the pair of phase difference detection pixels.

12. The solid-state imaging device according to claim 2, wherein the first phase difference detection pixel include the first photoelectric conversion unit and the charge accumulation unit in symmetrical positions in a second direction, with respect to an optical axis of the on-chip lens, and
wherein, in the phase difference detection, the driving control unit is further configured to read charge accumulated in the first photoelectric conversion unit in the first phase difference detection pixel and charge accumulated in the charge accumulation unit in the first phase difference detection pixel separately.

13. The solid-state imaging device according to claim 12, wherein the charge accumulation unit is configured to retain charge from the first photoelectric conversion unit.

14. The solid-state imaging device according to claim 12, wherein the first phase difference detection pixel includes a light-shielding film, wherein the light-shielding film includes the plurality of openings at the part of the first photoelectric conversion unit and the part of the charge accumulation unit, and
wherein the plurality of openings are in the symmetrical positions in the second direction, with respect to the optical axis of the on-chip lens.

15. The solid-state imaging device according to claim 1, wherein the charge accumulation unit is configured to retain charge from the first photoelectric conversion unit,
wherein the first phase difference detection pixel includes a transfer electrode,
wherein the transfer electrode is configured to transfer charge from the first photoelectric conversion unit to the charge accumulation unit,
wherein the transfer electrode is above the charge accumulation unit, and
wherein the transfer electrode comprises a transparent conductive film.

16. The solid-state imaging device according to claim 2, wherein at least one of the first imaging pixel or the first phase difference detection pixel shares constituent elements among other pixels of the pixel array unit.

17. The solid-state imaging device according to claim 16, wherein the constituent elements include at least one of a floating diffusion region, a reset transistor, an amplifier transistor, or a selection transistor.

18. A driving method, comprising:
in a solid state imaging device, wherein the solid state imaging device includes:
a pixel array unit comprising a plurality of imaging pixels for generating a captured image and a plurality of phase difference detection pixels for phase difference detection,
wherein a first imaging pixel of a plurality of imaging pixels and a first phase difference detection pixel of a plurality of phase difference detection pixels comprise an on-chip lens, a photoelectric conversion unit, and a charge accumulation unit; and
a driving control unit configured to drive the plurality of imaging pixels and the plurality of phase difference detection pixels,
wherein the charge accumulation unit of the first imaging pixel is shielded from light, and
wherein at least one of a part of the photoelectric conversion unit or a part of the charge accumulation unit of the phase difference detection pixel is unshielded from the light,
wherein a pair of phase difference detection pixels of the plurality of phase difference detection pixels includes a plurality of openings in symmetrical positions in a first direction, wherein the first direction is a direction in which the pair of phase difference detection pixels are arrayed with respect to optical axes of the on-chip lens of each of the pair of phase difference detection pixels,
wherein the photoelectric conversion unit includes a first opening of the plurality of openings in one of the pair of phase difference detection pixels, and
wherein the charge accumulation unit includes a second opening of the plurality of openings in other of the pair of phase difference detection pixels,
wherein the driving control unit is further configured to drive one of the pair of phase difference detection pixels,
wherein a first product of a first sensitivity of the photoelectric conversion unit and a first accumulation time in the one of the pair of phase difference detection pixels is equal to a second product of a second sensitivity of the charge accumulation unit and a second accumulation time in the other of the pair of phase difference detection pixels,
the driving method, comprising:
reading, in the phase difference detection by the solid-state imaging device, charge accumulated in at least the part of at least one of the photoelectric conversion unit or the part of the charge accumulation unit in the plurality of phase difference detection pixels; and
concurrently accumulating, in generation of the captured image by the solid-state imaging device, charge in the plurality of imaging pixels.

19. An electronic apparatus, comprising
a solid-state imaging device including:
a pixel array unit comprising a plurality of imaging pixels for generation of a captured image and a plurality of phase difference detection pixels for phase difference detection,
wherein a first imaging pixel of the plurality of imaging pixels and a first phase difference detection pixel of the plurality of phase difference detection pixels comprise an on-chip lens, a photoelectric conversion unit, and a charge accumulation unit, and
a driving control unit configured to drive the plurality of imaging pixels and the plurality of phase difference detection pixels,
wherein the charge accumulation unit of the first imaging pixel is shielded from light, and
wherein at least one of a part of the photoelectric conversion unit or a part of the charge accumulation unit of the phase difference detection pixel is unshielded from the light, wherein a pair of phase difference detection pixels of the plurality of phase difference detection pixels includes a plurality of openings in symmetrical positions in a first direction, wherein the first direction is a direction in which the pair of phase difference detection pixels are arrayed with respect to optical axes of the on-chip lens of each of the pair of phase difference detection pixels, wherein the photoelectric conversion unit includes a first opening of the plurality of openings in one of the pair of phase difference detection pixels, wherein the charge accumulation unit includes a second opening of the plurality of openings in other of the pair of phase difference detection pixels, wherein the driving control unit is further configured to drive one of the pair of phase difference detection pixels, wherein a first product of a first sensitivity of the photoelectric conversion unit and a first accumulation time in the one of the pair of phase difference detection pixels is equal to a second product of a second sensitivity of the charge accumulation unit and a second accumulation time in the other of the pair of phase difference detection pixels.

* * * * *